(12) United States Patent
Chen et al.

(10) Patent No.: US 11,264,287 B2
(45) Date of Patent: Mar. 1, 2022

(54) SEMICONDUCTOR DEVICE WITH CUT METAL GATE AND METHOD OF MANUFACTURE

(71) Applicant: Taiwan Semiconductor Manufacturing Company, Ltd., Hsinchu (TW)

(72) Inventors: Yi-Chun Chen, Hsinchu (TW); Ryan Chia-Jen Chen, Chiayi (TW); Shu-Yuan Ku, Zhubei (TW); Ya-Yi Tsai, Hsinchu (TW); I-Wei Yang, Yilan County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 50 days.

(21) Appl. No.: 16/787,625

(22) Filed: Feb. 11, 2020

(65) Prior Publication Data
US 2021/0249313 A1 Aug. 12, 2021

(51) Int. Cl.
*H01L 21/8238* (2006.01)
*H01L 27/092* (2006.01)

(52) U.S. Cl.
CPC ........ *H01L 21/823828* (2013.01); *H01L 21/823821* (2013.01); *H01L 21/823878* (2013.01); *H01L 27/0924* (2013.01)

(58) Field of Classification Search
CPC ..... H01L 21/823828; H01L 21/823821; H01L 27/0924; H01L 21/823878
See application file for complete search history.

(56) References Cited

U.S. PATENT DOCUMENTS

| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |

(Continued)

FOREIGN PATENT DOCUMENTS

| DE | 102018128193 A1 | 4/2020 |
| JP | 2007529115 A | 10/2007 |

(Continued)

*Primary Examiner* — Karen Kusumakar
*Assistant Examiner* — Adam S Bowen
(74) *Attorney, Agent, or Firm* — Slater Matsil, LLP

(57) ABSTRACT

An anchored cut-metal gate (CMG) plug, a semiconductor device including the anchored CMG plug and methods of forming the semiconductor device are disclosed herein. The method includes performing a series of etching processes to form a trench through a metal gate electrode, through an isolation region, and into a semiconductor substrate. The trench cuts-through and separates the metal gate electrode into a first metal gate and a second metal gate and forms a recess in the semiconductor substrate. Once the trench has been formed, a dielectric plug material is deposited into the trench to form a CMG plug that is anchored within the recess of the semiconductor substrate and separates the first and second metal gates. As such, the anchored CMG plug provides high levels of resistance to reduce leakage current within the semiconductor device during operation and allowing for improved V-trigger performance of the semiconductor device.

20 Claims, 12 Drawing Sheets

(56) References Cited

U.S. PATENT DOCUMENTS

| | | | |
|---|---|---|---|
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 9,911,736 B1 * | 3/2018 | Zang | H01L 29/78651 |
| 10,121,875 B1 | 11/2018 | Ho et al. | |
| 10,461,186 B1 * | 10/2019 | Zhang | H01L 29/66666 |
| 2010/0048026 A1 | 2/2010 | Sone et al. | |
| 2018/0033699 A1 | 2/2018 | Zhu | |
| 2018/0033700 A1 | 2/2018 | Jacob | |
| 2019/0165155 A1 | 5/2019 | Chang et al. | |
| 2019/0189523 A1 | 6/2019 | Zhu et al. | |
| 2019/0393324 A1 | 12/2019 | Chen et al. | |

FOREIGN PATENT DOCUMENTS

| | | |
|---|---|---|
| KR | 20100024356 A | 3/2010 |
| KR | 20160140321 A | 12/2016 |
| KR | 20190064426 A | 6/2019 |
| WO | 2005065385 A2 | 7/2005 |

* cited by examiner

X-cut

Y-cut

X-cut

Y-cut

X-cut

Y-cut

X-cut

Y-cut

X-cut

Y-cut

SEMICONDUCTOR DEVICE WITH CUT METAL GATE AND METHOD OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
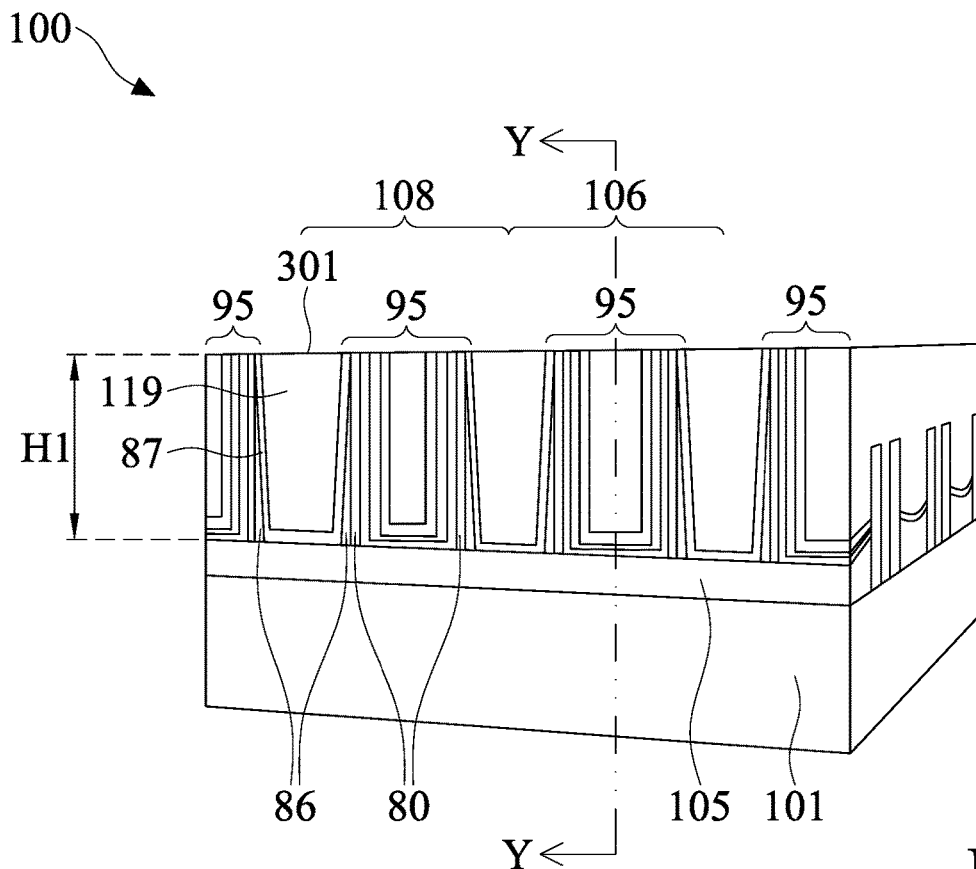
FIGS. 1A-1B through 8A-8B illustrate perspective views of cross-sections of resulting structures during intermediate steps of forming a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below with respect to a process utilized to form an anchored cut metal gate (CMG) plug within a cut metal gate process. However, the embodiments may be applicable to a large variety of applications, and are not limited to those embodiments described herein.

Figure 1B:
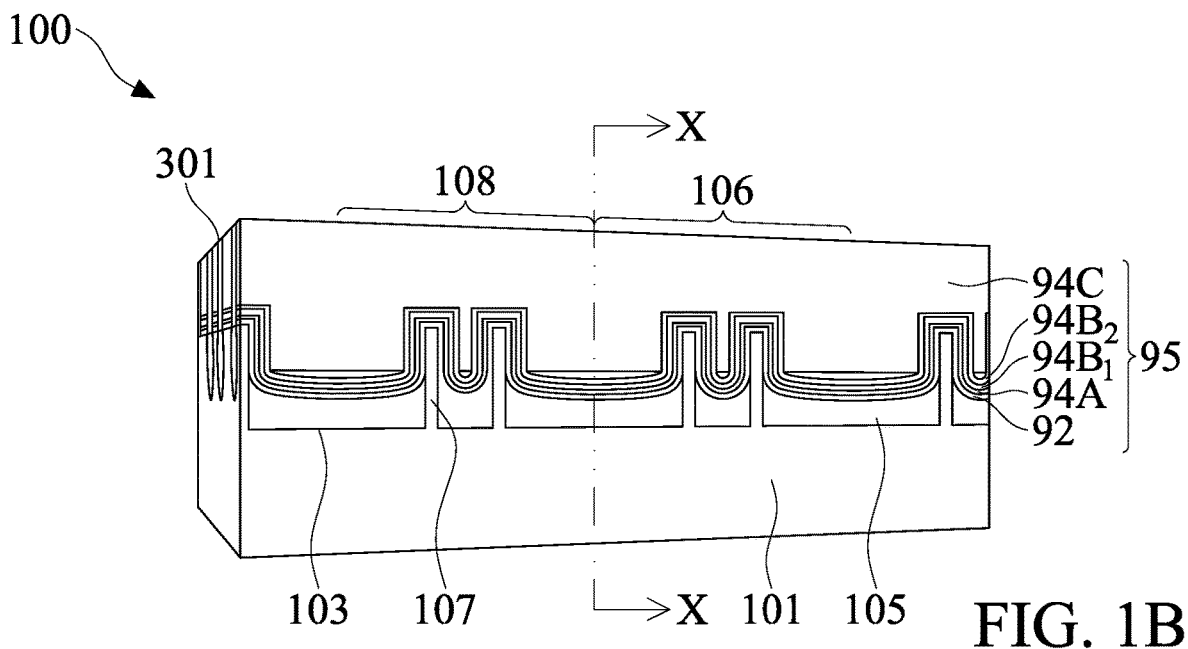

With reference now to FIGS. 1A and 1B, there are illustrated cross-sectional perspective views of metal gates over semiconductor fins for a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

FIGS. 1A and 1B further illustrate that the substrate 101 may be separated into a first device region 106 and a second device region 108 for forming different types of devices. For example, the first device region 106 may be used to form n-type devices such as NMOS transistors (e.g., n-type gate all around transistors) and the second device region 108 may be used to form p-type devices, such as PMOS transistors (e.g., p-type gate all around transistors). However, p-type devices or n-type devices may be formed in either of the first device region 106 and the second device region 108 based on a desired application. To separate the first device region 106 and the second device region 108, wells (not separately illustrated in FIG. 1B) may be formed within the substrate 101 with n-type dopants and p-type dopants. To form the desired wells, the n-type dopants and the p-type dopants are implanted into the substrate 101 depending upon the devices that are desired to be formed. For example, n-type dopants such as phosphorous or arsenic may be implanted to form n-type wells, while p-type dopants such as boron may be implanted to form p-type wells. The n-type wells and p-type wells may be formed using one or more implantation techniques such as diffusion implantations, ion implantations (e.g., plasma doping, beam line implant doping), selective implantations, deep-well implantations, and the like, or combinations thereof. Masking techniques may also be utilized to mask some regions (e.g., second device regions 108) of the substrate 101 while exposing other regions (e.g., first device regions 106) of the substrate 101 during a first well implantation (e.g., n-type wells) process.

Once the first well implantation process has been completed, the mask is removed to expose the previously masked regions (e.g., second device region 108) and another mask may be placed over the previously exposed regions (e.g., first device region 106) during a second well implantation (e.g., p-type wells) process. In some embodiments, further doping implantations may be performed to form deep well implant regions within the substrate 101.

The first trenches 103 may be formed as an initial step in the eventual formation of first isolation regions 105. The first trenches 103 may be formed using a masking layer along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. These fins 107 may be used, as discussed below, to form the channel region of multiple-gate FinFET transistors. While FIGS. 1A and 1B only illustrate six fins formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Additionally, while the above description provides one example embodiment, the fins 107 may be patterned by any suitable method. For example, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 1000 Å, such as about 540 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric (or interface oxide), a dummy gate electrode over the dummy gate dielectric, gate seal spacers 80, and gate spacers 86 may be formed over each of the fins 107. In an embodiment the dummy gate dielectric may be formed by thermal oxidation, chemical vapor deposition, sputtering, or any other methods known and used in the art for forming a gate dielectric. Depending on the technique of gate dielectric formation, the dummy gate dielectric thickness on the top of the fins 107 may be different from the gate dielectric thickness on the sidewall of the fins 107.

The dummy gate dielectric may comprise a material such as silicon dioxide or silicon oxynitride with a thickness ranging from about 3 angstroms to about 100 angstroms, such as about 10 angstroms. The dummy gate dielectric may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric.

The dummy gate electrode may comprise a conductive material and may be selected from a group comprising of polysilicon (e.g., a dummy polysilicon (DPO)), W, Al, Cu, AlCu, W, Ti, TiAlN, TaC, TaCN, TaSiN, Mn, Zr, TiN, Ta, TaN, Co, Ni, combinations of these, or the like. The dummy gate electrode may be deposited by chemical vapor deposition (CVD), sputter deposition, or other techniques known and used in the art for depositing conductive materials. The thickness of the dummy gate electrode may be in the range of about 5 Å to about 200 Å. The top surface of the dummy gate electrode may have a non-planar top surface, and may be planarized prior to patterning of the dummy gate electrode or gate etch. Ions may or may not be introduced into the dummy gate electrode at this point. Ions may be introduced, for example, by ion implantation techniques.

Once formed, the dummy gate dielectric and the dummy gate electrode may be patterned to form a series of dummy gate stacks over the fins 107. The dummy gate stacks define multiple channel regions located on each side of the fins 107 beneath the dummy gate dielectric. Dummy gate stacks may be formed by depositing and patterning a gate mask (not separately illustrated in FIGS. 1A and 1B) on the dummy gate electrode using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The material layers of the dummy gate electrode and the dummy gate dielectric may be etched using a dry etching process to pattern the materials into the dummy gate stacks.

Once the materials have been patterned into the dummy gate stacks, the gate seal spacers 80 and the gate spacers 86 may be formed over the dummy gate stacks. The gate seal spacers 80 and the gate spacers 86 are formed on opposing sides of the dummy gate stacks.

The gate seal spacers 80 can be formed on exposed surfaces of the dummy gate stacks, the gate mask, and/or the fins 107. For example, the gate seal spacers 80 may be formed along sidewalls of the dummy gate stacks. A thermal oxidation or a deposition followed by an anisotropic etch may be used to form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. Suitable lithography techniques (e.g., masking) and materials (e.g., photoresist) may be used to expose selected regions of the present structure in preparation for implantation of impurities within LDD regions. Appropriate types of impurities (e.g., p-type and n-type) may be implanted into the exposed fins 107 in the selected regions while masking and protecting the non-selected regions during implantations. After implantation, the masks may be removed. As such, one or more regions may be lightly doped with one or more types of impurities using a series of suitable lithographic techniques and suitable implantation techniques. According to some embodiments, the lightly doped source/drain regions may have a concentration of impurities from about $10^{15}$ cm$^{-3}$ to about $10^{19}$ cm$^{-3}$. An anneal process may be used to repair implant damage and to activate the implanted impurities.

The gate spacers 86 are formed along the sidewalls of the gate seal spacers 80 opposite the dummy gate stacks. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, SiCON, SiN, oxynitride, SiC, SiOC, a combination thereof, or the like and may be formed by methods utilized to form such a spacer layer (e.g., chemical vapor deposition (CVD), plasma enhanced chemical vapor deposition (PECVD), sputtering, and any other suitable methods known in the art).

In an embodiment the gate spacers 86 may be formed to have a thickness of between about 10 Å and about 100 Å. Additionally, gate spacers 86 of adjacent dummy gate stacks may be separated by a first distance of between about 50 Å and about 500 Å, such as about 200 Å. However, any suitable thicknesses and any suitable distances may be utilized.

Once the gate spacers 86 have been formed, a removal and re-growth of the fins 107 from those areas not protected by the dummy gate stacks and the gate spacers 86 may optionally be performed. The removal of the fins 107 from those areas not protected by the stacks and the gate spacers 86 may be performed by a reactive ion etch (RIE) using the dummy gate stacks and the gate spacers 86 as hardmasks, or by any other suitable removal process. The removal may be continued until the fins 107 are either planar with or below the surface of the first isolation regions 105.

Once these portions of the fins 107 have been removed, a hard mask (not separately illustrated), is placed and patterned to cover the dummy gate electrode to prevent growth thereon during the regrowth of the source/drain regions 901 (not illustrated in FIGS. 1A-1B but seen in FIG. 9 below). In some embodiments, the source/drain regions 901 are regrown in contact with each of the fins 107. In some embodiments the source/drain regions 901 may be regrown to form a stressor that will impart a stress to the channel regions of the fins 107 located underneath the dummy gate stacks. In an embodiment wherein the fins 107 comprise silicon and the FinFET is a p-type device, the source/drain regions 901 may be regrown through a selective epitaxial process with a material (e.g., silicon, silicon germanium, silicon phosphorous, and the like) having a different lattice constant than the material of the channel regions. The epitaxial growth process may use precursors such as silane, dichlorosilane, germane, and the like, and may continue for between about 5 minutes and about 120 minutes, such as about 30 minutes. In other embodiments the source/drain regions 901 may comprise materials such as GaAs, GaP, GaN, InP, InAs, InSb, GaAsP, AlGaN, AlInAs, AlGaAs, GaInAs, GaInP, and/or GaInAsP; or combinations, or the like. However, any suitable materials may be utilized. Depending on a desired application, the epitaxial growth materials of the source/drain regions 901 of a device may be formed over each of the fins 107 as separate distinct epitaxial growth regions or the separate distinct epitaxial growth regions may be grown together into a merged epitaxial growth structure.

Once the source/drain regions 901 are formed, dopants may be implanted into the source/drain regions 901 by implanting appropriate dopants to complement the dopants in the fins 107. For example, p-type dopants such as boron, gallium, indium, or the like may be implanted to form a PMOS device. In another embodiment, n-type dopants such as phosphorous, arsenic, antimony, or the like may be implanted to form an NMOS device. These dopants may be implanted using the dummy gate stacks, the gate seal spacers 80, and the gate spacers 86 as masks. It should be noted that one of ordinary skill in the art will realize that many other processes, steps, or the like may be used to implant the dopants. For example, one of ordinary skill in the art will realize that a plurality of implantation processes may be performed using various combinations of spacers and liners to form the source/drain regions 901 having a specific shape or characteristic suitable for a particular purpose. Any such processes or any other suitable process may be used to implant the dopants, and the above description is not meant to limit the present embodiments to the steps presented above.

Additionally at this point the hard mask that covered the dummy gate electrode during the formation of the source/drain regions 901 is removed. In an embodiment the hard mask may be removed using, e.g., a wet or dry etching process that is selective to the material of the hard mask. However, any suitable removal process may be utilized.

Once the source/drain regions 901 have been grown and LDD regions have been suitably implanted, a contact etch stop layer (CESL) 87 is formed over the source/drain regions 901. The dielectric material of the CESL 87 may be conformally deposited over exposed surfaces in the source/drain regions 901 and along exposed sidewalls of the gate spacers 86 and exposed sidewalls of the gate seal spacers 80 facing the source/drain regions 901, and over planar surfaces of the gate seal spacers 80 and the dummy gate mask at the upper surface of the dummy gate stacks. According to some embodiments, the CESL 87 may be formed using a chemical vapor deposition (CVD) process to expose the structure to one or more precursors and to a plasma activation process conducted in a deposition chamber. The CVD process may be an atomic layer deposition (ALD), a plasma enhanced chemical vapor deposition (PECVD), a low pressure chemical vapor deposition (LPCVD), or the like.

According to some embodiments, the dielectric material of the CESL 87 is conformally deposited as a complex compound comprising SiN (e.g., SiCN, SiOCN, or the like) or other suitable compounds such as SiOC and is formed to a thickness of between about 20 Å and about 60 Å, such as about 40 Å. However, any suitable materials, compounds, and/or thicknesses may be utilized.

An inter-layer dielectric (ILD) layer 119 (e.g., an ILD0 layer) is then formed over the CESL 87. The ILD layer 119 may comprise a material such as silicon oxide ($SiO_2$) or boron phosphorous silicate glass (BPSG), although any suitable dielectrics may be used. The ILD layer 119 may be formed over the CESL 87 and over source/drain regions 901 using a process such as PECVD, although other processes, such as LPCVD, may also be used. The ILD layer 119 may be formed to a thickness of between about 100 Å and about 3,000 Å. However, any suitable thickness may be utilized.

After the ILD layer 119 has been formed, the ILD layer 119 may be planarized in order to prepare the ILD layer 119 for further processing. In an embodiment the ILD layer 119 and CESL 87 may be planarized using a planarization process such as chemical mechanical polishing (CMP) so that the ILD layer 119 and CESL 87 are coplanar with the dummy gate stacks. As such, top surfaces of the dummy gate electrodes, the gate seal spacers 80, the gate spacers 86, the CESL 87 and the ILD layer 119 are coplanar. Accordingly, the top surfaces of the dummy gate electrodes are exposed through the ILD layer 119. In some embodiments, the dummy gate masks or portions thereof may remain, in which case the planarization process levels the top surface of the ILD layer 119, the CESL 87, the gate seal spacers 80, and the gate spacers 86 with the top surfaces of the dummy gate masks. However, any other suitable method, such as one or more etching processes, may also be utilized.

Once the ILD layer 119 has been planarized, components of the dummy gate stack (e.g., any remaining portion of the dummy gate mask, the dummy gate electrode and the dummy gate dielectric) may then be removed. In an embodiment one or more etches, such as one or more wet etch processes, may be used to remove these components of the dummy gate stack. However, any suitable removal process may be utilized.

Once the dummy gate stack has been removed, the openings left behind may be refilled to form a metal gate stack 95. According to some embodiments, the metal gate stack 95 comprises a gate dielectric layer 92, a liner layer 94A, any number of work function tuning layers 94B, and a fill material 94C.

In some embodiments, the gate dielectric layer 92 is a high-k material such as $HfO_2$, HfSiO, HfSiON, HfTaO, HTiO, HfZrO, LaO, ZrO, $Ta_2O_5$, combinations of these, or the like, deposited through a process such as atomic layer deposition, chemical vapor deposition, or the like. The gate dielectric layer 92 may be deposited to a thickness of between about 5 Å and about 200 Å, although any suitable material and any suitable thickness may be utilized.

The liner layer 94A may be formed adjacent to the gate dielectric layer 92 and may be formed from a metallic material such as TiSi, Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The liner layer 94A may be deposited using a deposition process such as atomic layer deposition, chemical vapor deposition, sputtering, or the like, to a thickness of between about 5 Å and about 200 Å, although any suitable deposition process or any suitable thickness may be used. According to some embodiments, a plurality of liner layers may be formed adjacent to the gate dielectric layer 92.

The first work function tuning layer $94B_1$ may be formed adjacent to the liner layer 94A and, in some embodiments, may be similar to the liner layer 94A. For example, the first work function tuning layer $94B_1$ may be formed from a metallic material such as TaN, Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first work function tuning layer $94B_1$ may be deposited using a deposition process such as atomic layer deposition, chemical vapor deposition, sputtering, or the like, to a thickness of between about 5 Å and about 200 Å, although any suitable deposition process and any suitable thickness may be used.

The second work function tuning layer $94B_2$ may be formed adjacent to the first work function tuning layer $94B_1$. According to some embodiments, the second work function tuning layer $94B_2$ may be similar to the liner layer 94A. For example, the second work function tuning layer $94B_2$ may be formed from a metallic material such as TiAlC, TaN, Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second work function tuning layer 94B$_2$ may be deposited using a deposition process such as atomic layer deposition, chemical vapor deposition, sputtering, or the like, to a thickness of between about 5 Å and about 200 Å, although any suitable deposition process or any suitable thickness may be used.

The fill material 94C fills a remainder of the opening left behind by the removal of the dummy gate electrode. In an embodiment the fill material 94C is a metallic material such as W, TiN, Al, Cu, AlCu, W, Ti, TiAlN, TaC, TaCN, TaSiN, Mn, Zr, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode. In a particular embodiment the fill material 94C may be deposited to a thickness of between about 5 Å and about 500, although any suitable material, deposition process, and thickness may be utilized.

Once the opening left behind by the removal of the dummy gate electrode has been filled, the materials may be planarized in order to remove any material that is outside of the opening left behind by the removal of the dummy gate electrode. In a particular embodiment the removal may be performed using a planarization process such as chemical mechanical planarization (CMP), until the metal gate stack 95 has first heights H1 over the fins 107 of between about 400 Å and about 600 Å, such as about 490 Å. However, any suitable planarization and removal process and any suitable height may be utilized to form the metal gate stack 95.

Once the metal gate stack 95 has been planarized, a first hard mask 301 may be formed over the structure. In an embodiment the first hard mask 301 is a material such as titanium nitride or tantalum nitride formed through a deposition process such as atomic layer deposition (ALD), chemical vapor deposition (CVD), or physical vapor deposition (PVD). The first hard mask 301 may be formed to a thickness of between about 3 nm and about 10 nm, such as about 5 nm. However, any suitable material, process of deposition, and thicknesses may be utilized.

Following the deposition of the first hard mask 301, a back-side cleaning process may be performed. The back-side cleaning process may comprise one or more cleaning methods (e.g., surface cleaning, de-oxide process and/or surface activation) in order to any remaining remove CMP slurry and native oxide layers from surfaces of the first hard mask 301. A de-oxide process may also be used to remove native oxide layers. Any combination of these cleaning methods or any other suitable cleaning methods may also be utilized.

FIG. 1A illustrates, in particular, a cross-sectional view (X-Cut) of the semiconductor device 100 taken through the metal gate stacks 95 of adjacent device regions in a region between adjacent fins 107 of the first device region 106 and the second device region 108 in a direction along the length of the fins 107 in the substrate 101. In some embodiments, the metal gate stack 95 has a first gate length of between about 400 Å and about 3,000 Å, such as about 1000 Å. However, any suitable gate length may be utilized. Furthermore, the metal gate stack 95 may be formed in the first device region 106 using materials (e.g., the gate dielectric layer 92, the liner layer 94A, the work function tuning layers 94B, and the fill material 94C) that are suitable for forming e.g., the n-type device and may be formed in the second device region 108 using materials (e.g., the gate dielectric layer 92, the liner layer 94A, the work function tuning layers 94B, and the fill material 94C) that are suitable for forming e.g., the p-type device. FIG. 1A further illustrates a cutline Y-Y through the metal gate stack 95 of the second device region 108.

FIG. 1B illustrates, in particular, a cross-sectional view (Y-cut) of the semiconductor device 100 taken along the length of the metal gate stack 95 of the second device region 108 of FIG. 1A. FIG. 1B further illustrates that the metal gate stack 95 may extend over the fins 107 of adjacent device regions (e.g., the second device region 108 and another of the first device regions 106). As can be seen, the metal gate stack 95 extends over multiple ones of the fins 107. Additionally, while six fins are illustrated, this number is intended to be illustrative and is not intended to be limiting in any fashion. FIG. 1B further illustrates a cutline X-X through the metal gate stack 95 between the adjacent device regions.

Figure 2A:
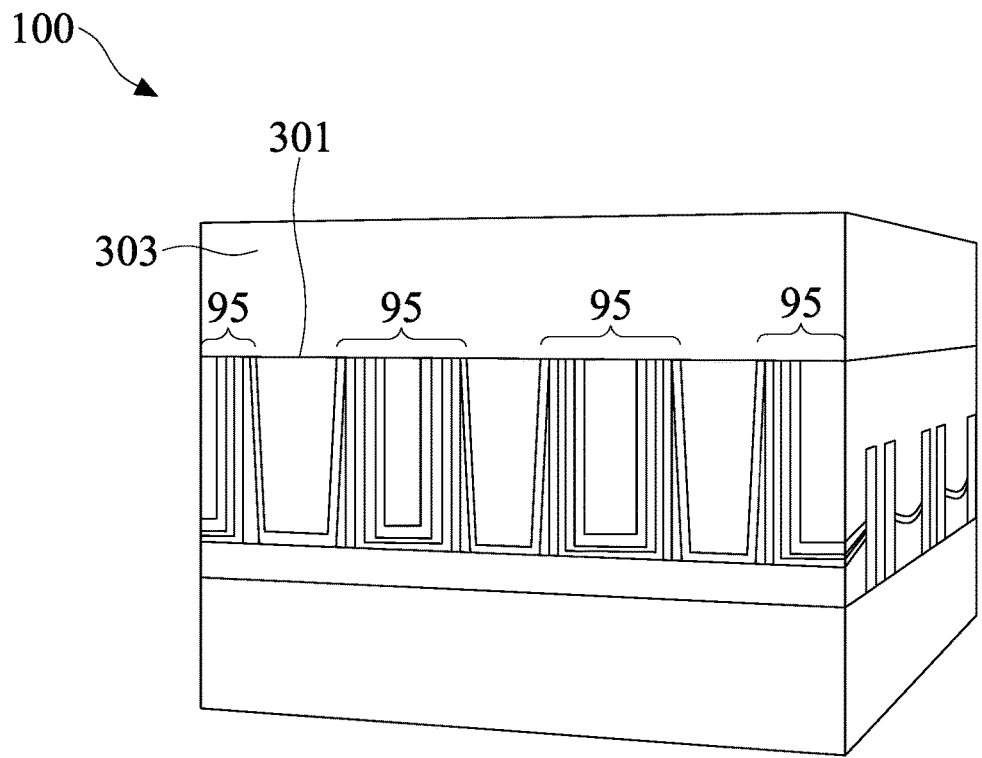
Figure 2B:
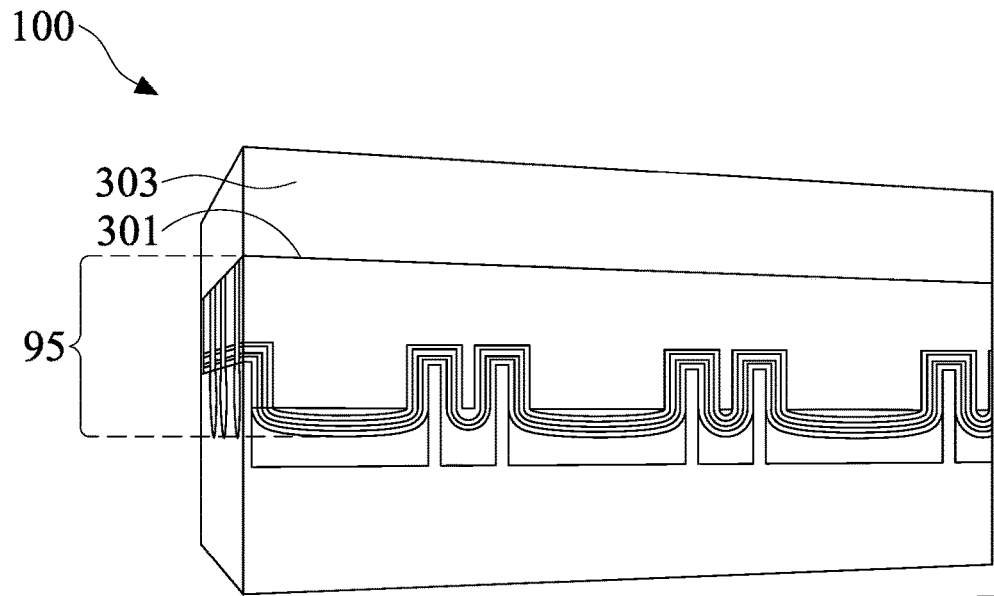

FIGS. 2A and 2B illustrate a formation of a second hard mask 303 over the first hard mask 301. In an embodiment the second hard mask 303 may be a single layer of material or else may be a compound layer of a plurality of materials, such as a dual layer of materials. According to some embodiments, the materials of the second hard mask 303 comprise dielectric materials such as silicon nitride (SiN) or silicon carbon nitride (SiCN). However, any suitable material or combination of materials may be utilized.

In embodiments in which the second hard mask 303 comprises a dual layer of materials, a first sub-layer of the dual layer of materials may be formed of a first dielectric material (e.g., silicon nitride (SiN)) using a deposition process such as ALD, CVD, or PVD to a thickness of between about 30 nm and about 40 nm, such as about 34 nm. A second sub-layer of the dual layer of materials may be formed with a second dielectric material or either the same material (e.g., silicon nitride (SiN)) or a different material (e.g., silicon carbon nitride (SiCN)) using a deposition process such as ALD, CVD, or PVD to a thickness of between about 30 nm and about 40 nm, such as about 34 nm. However, any suitable deposition process and any suitable thicknesses may be utilized.

After the second hard mask 303 has been formed, an optional surface treatment may be performed on the second hard mask 303 in order to help protect the second hard mask 303 and prepare the second hard mask 303 for additional processing. In an embodiment the optional surface treatment may be a descum treatment such as a plasma treatment wherein the surface of the second hard mask 303 is exposed to a plasma of, e.g., argon, nitrogen, oxygen or a mixed Ar/N$_2$/O$_2$ ambient environment. An optional scrub clean process may also be performed. However, any suitable surface treatment, any suitable cleaning process, and any suitable combination thereof may also be utilized.

Figure 3A:
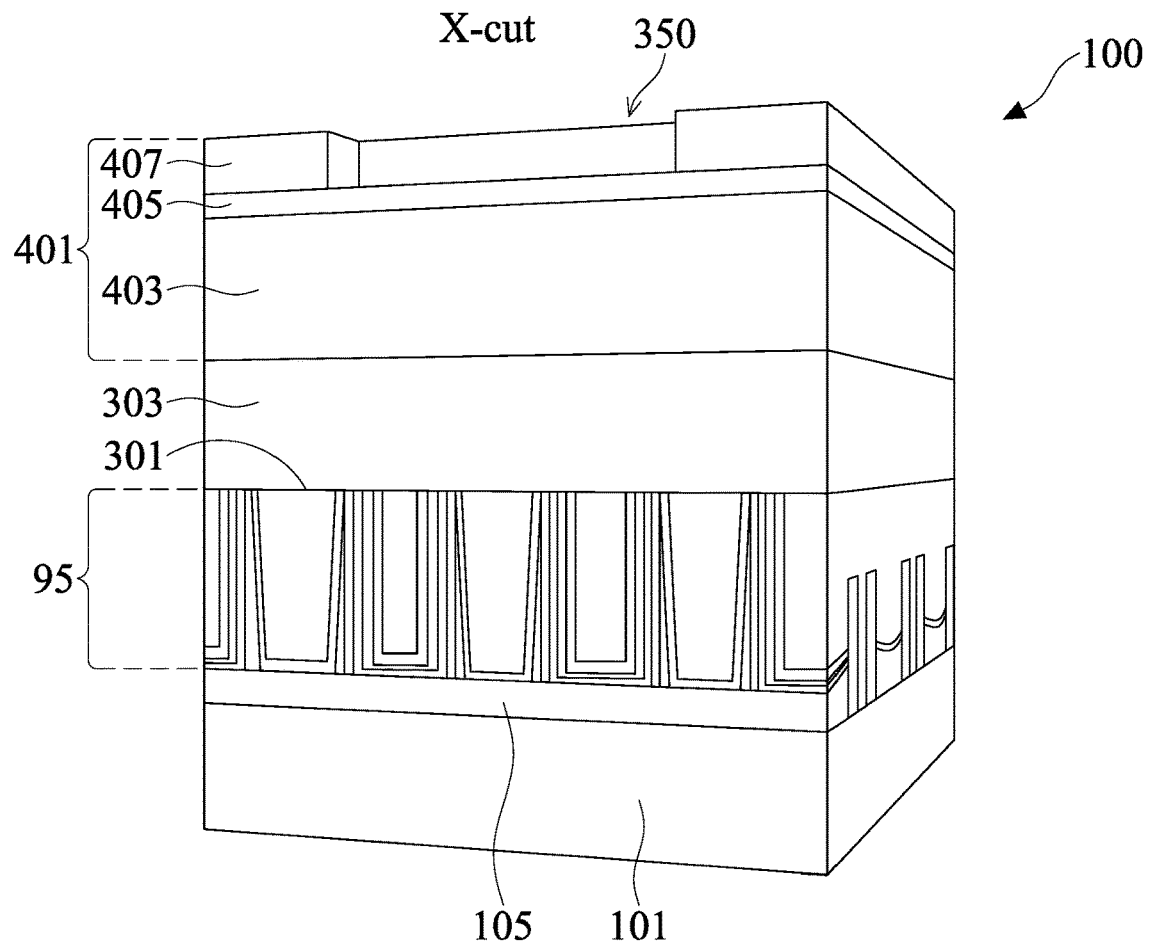
Figure 3B:
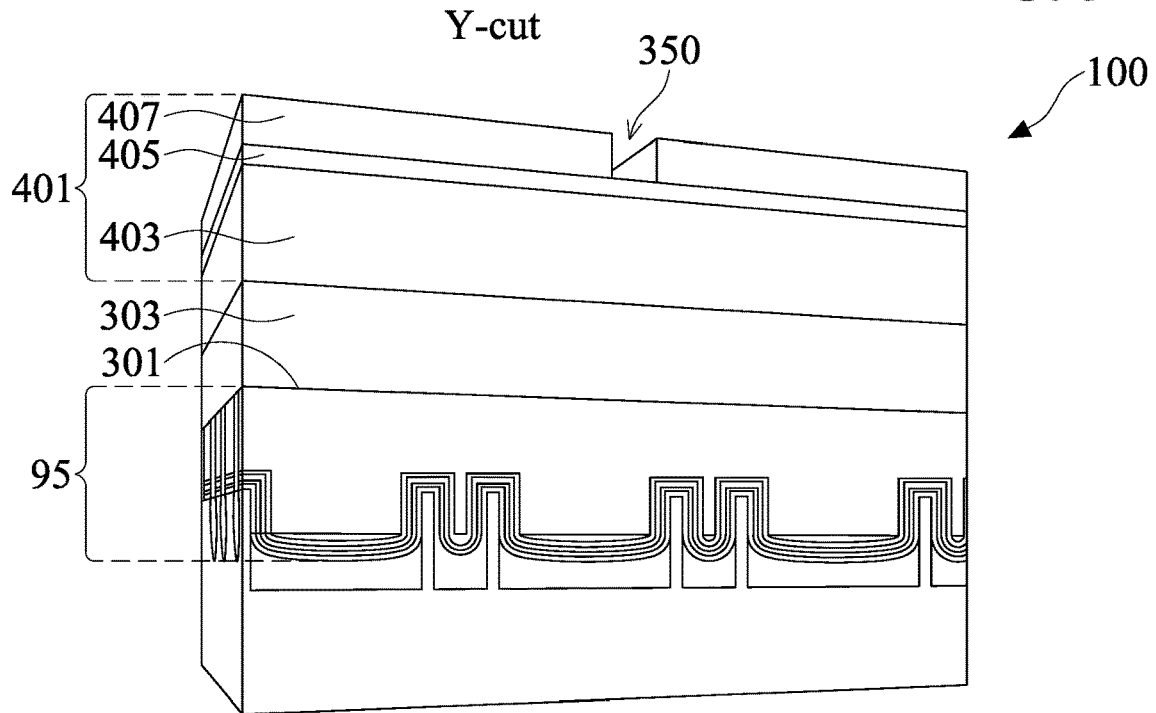

FIGS. 3A-3B illustrate placing a first photoresist 401 over the second hard mask 303 and then exposing and developing the first photoresist 401 to pattern the first photoresist 401 to form a mask used to subsequently pattern the second hard mask 303. In an embodiment the first photoresist 401 is a tri-layer photoresist comprising a bottom anti-reflective coating (BARC) layer 403, an intermediate mask layer 405, and a top photoresist layer 407. FIGS. 3A-3B further illustrate, in embodiments where the first photoresist 401 is a tri-layer photoresist, a first pattern 350 being formed in the top photoresist layer 407 using for example extreme ultraviolet light (EUV). However, any suitable type of photosensitive material, combination of materials, and any suitable patterning process may be utilized.

Figure 4A:
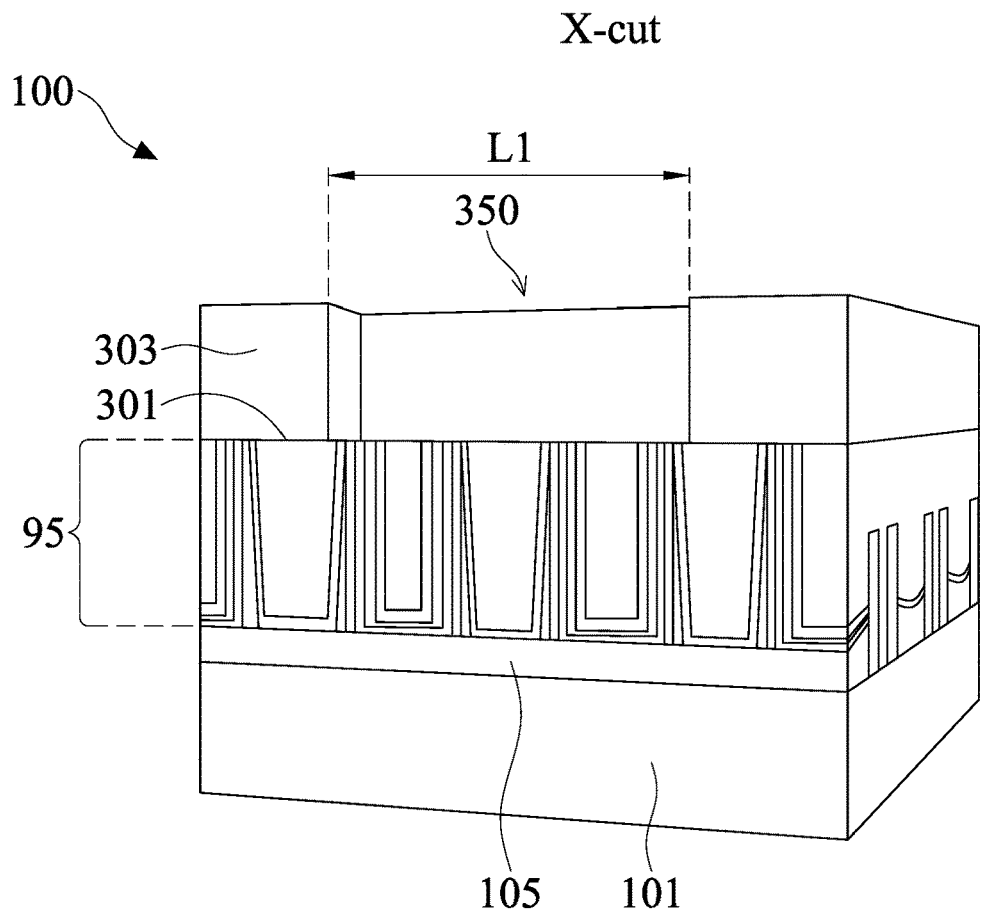
Figure 4B:
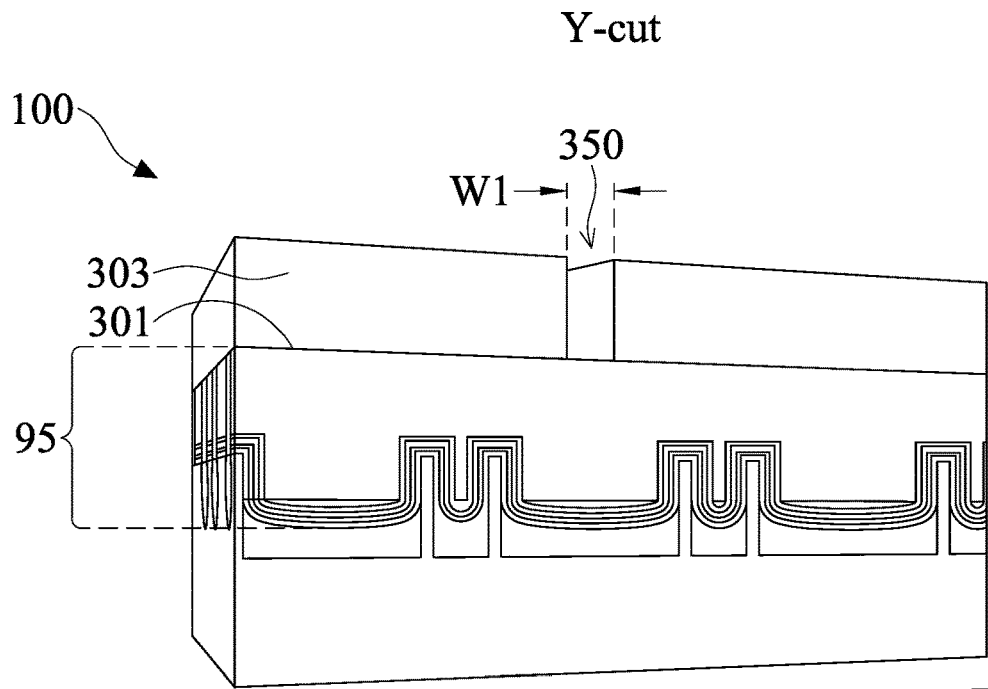

FIGS. 4A-4B illustrate that once patterned, the first pattern 350 of the first photoresist 401 is then transferred to the second hard mask 303, the first hard mask 301 being exposed through the first pattern 350 of the second hard mask 303. In an embodiment the transfer of the first pattern 350 can occur using, e.g., one or more anisotropic etching processes such as one or more reactive ion etching processes to sequentially etch through the intermediate mask layer 405, the BARC layer 403, and the second hard mask 303. According to some embodiments, the pattern of the second hard mask 303 may have a first length L1 of between about 70 nm and about 150 nm, such as about 125 nm and a first width W1 of between about 16 nm and about 30 nm, such as about 21 nm. However, any suitable process, any suitable widths, and any suitable lengths may be utilized.

Additionally, once the second hard mask 303 has been patterned, the first photoresist 401 may be removed if it has not already been removed during the one or more of the etching processes. In an embodiment the top photoresist layer 407 may be removed using a thermal process such as ashing, whereby the temperature of the top photoresist layer 407 is increased until the top photoresist layer 407 undergoes a thermal decomposition and can be easily removed. Once the top photoresist layer 407 has been removed, the intermediate mask layer 405 and the bottom anti-reflective coating (BARC) layer 403 may be removed using one or more etching processes.

If desired, a wet clean may be performed during or after the removal of the first photoresist 401. In an embodiment a solution such as an SC-1 or SC-2 cleaning solution may be utilized, although other solutions, such as a mixture of $H_2SO_4$ and $H_2O_2$ (e.g., sulfuric peroxide mixture (SPM)), or a solution of hydrogen fluoride (HF), may also be utilized. A charge process (e.g., nitrogen ($N_2$) charge) may also be utilized in order to purge any undesired contaminants or reactants. However, any suitable solution or any suitable processes may be used and are fully intended to be included within the scope of the embodiments.

Figure 5A:
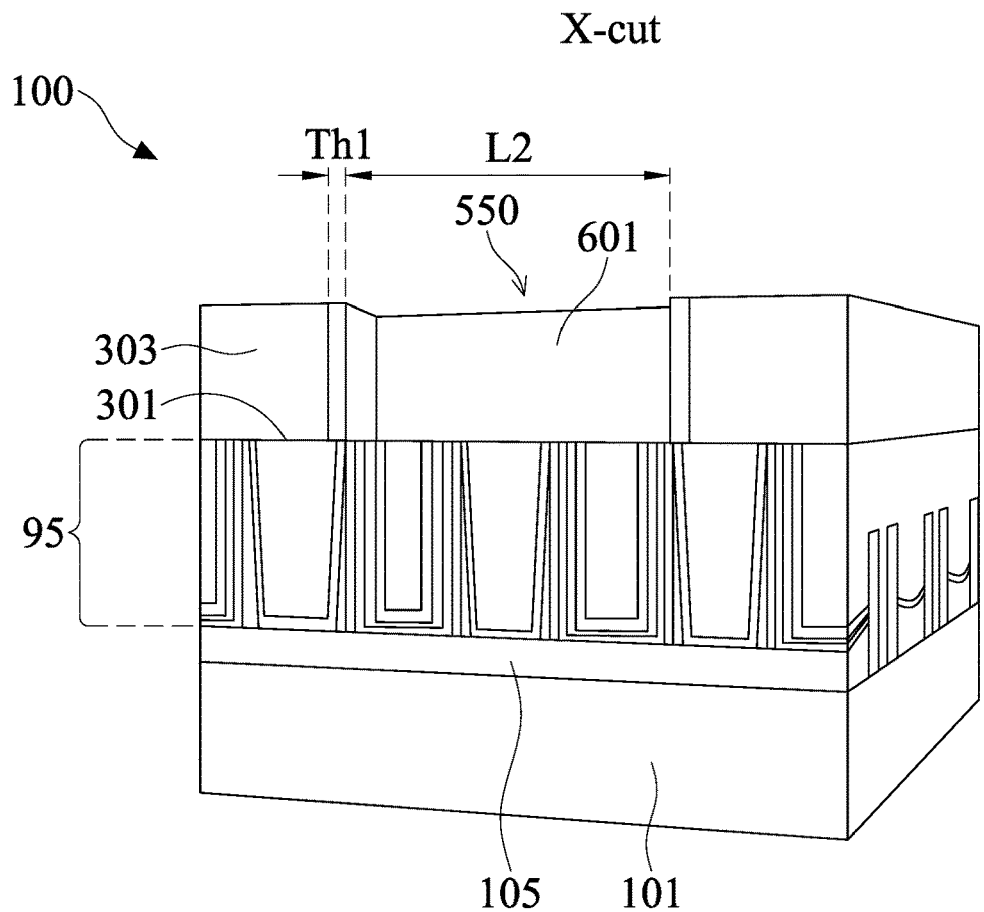
Figure 5B:
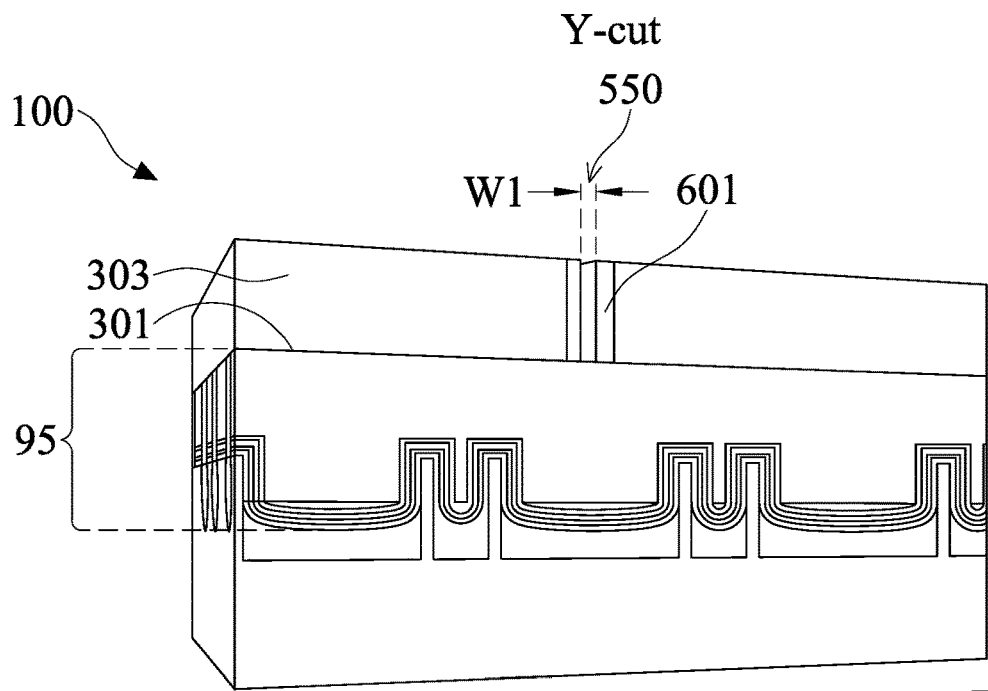
Figure 6A:
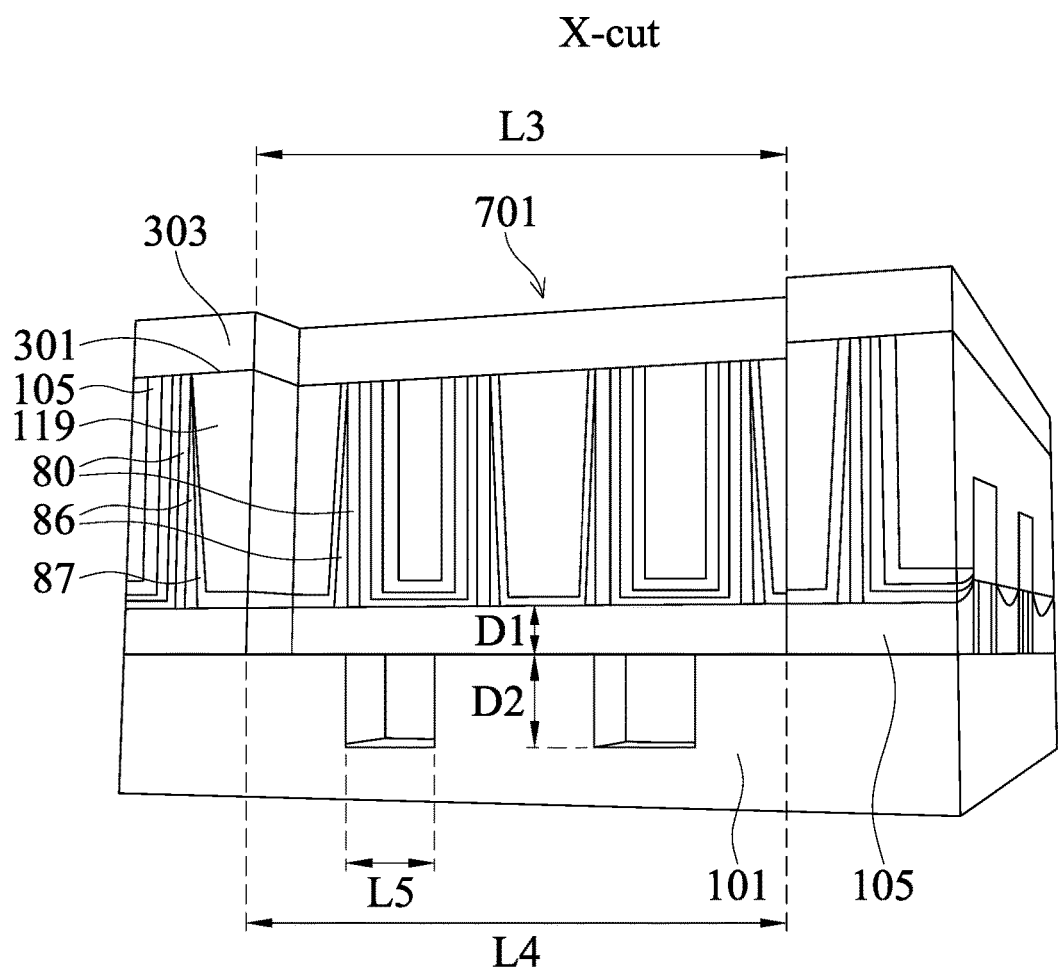
Figure 6B:
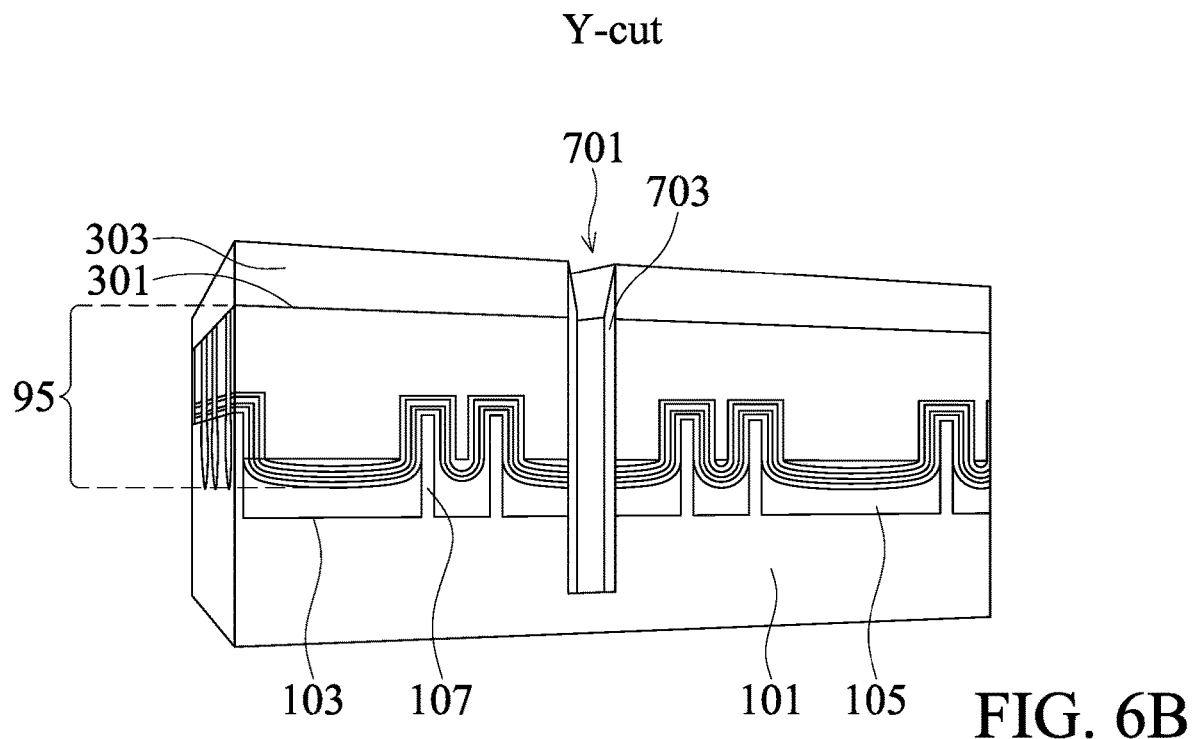

Continuing to FIGS. 5A-5B, these figures illustrate the beginning steps of a multi-step etching and deposition process which is utilized to form a trench 701 (not illustrated in FIGS. 5A-5B but illustrated in FIGS. 6A-6B). In such a process an initial masking layer 601 is deposited along sidewalls of the second pattern 550, and the deposition is followed by a dielectric breakthrough process in order to expose the underlying material while leaving behind the masking layer 601 along the sidewalls. With the sidewalls protected by the masking layer 601 and the underlying material exposed, another etching process is utilized to extend the trench 701 downwards without widening the trench 701 laterally. Further, because some of the masking layer 601 may be consumed by the etching process, the multi-step process (e.g., deposition of masking layer, dielectric breakthrough etch, and extension of the trench 701) may be repeated to extend the trench 701 further with each repetition without widening the width of the trench 701, as discussed in detail in the following paragraphs.

Looking first at the deposition of the masking layer, in an embodiment the masking layer 601 may comprise a material that is similar to the material of the second hard mask 303. As such, in an embodiment in which the second hard mask 303 is formed of silicon nitride (SiN), the masking layer 601 may also be formed of silicon nitride (SiN). However, the masking layer 601 may also comprise other materials or other compositions different from those of the second hard mask 303.

In an embodiment the masking layer 601 may be deposited using a deposition process such as atomic layer deposition, chemical vapor deposition, sputtering, combinations of these, or the like. According to some embodiments, the masking layer 601 may be formed as a conformal layer over the second hard mask 303, along vertical sidewalls of the first pattern 350 formed in the second hard mask 303, and over the first hard mask 301 within the first pattern 350. In some embodiments, the masking layer 601 is formed to a first thickness Th1 of between about 1.5 nm and about 7 nm, such as about 5 nm. For example, in a particular embodiment, the masking layer 601 is formed to the first thickness Th1 of between about 1.5 nm and about 7 nm, such as about 5 nm. However, any suitable deposition process and any suitable thickness may be utilized.

FIGS. 5A-5B further illustrate a continuation of the cut metal gate process that can be performed once the masking layer 601 has been deposited. In an embodiment the bottom portion of masking layer 601 may be removed in an anisotropic etching process, whereas, the vertical portions of masking layer 601 remain along vertical sidewalls of the first pattern 350 in the second hard mask 303. As such, the size of the first pattern 350 is reduced by the thickness of the remaining portions of the masking layer 601 forming a second pattern 550 in the second hard mask 303 and exposing the first hard mask 301 through the second pattern 550. According to some embodiments, the second pattern 550 in the second hard mask 303 has a second length L2 of between about 60 nm and about 140 nm, such as about 115 nm and a second width W2 of between about 6 nm and about 20 nm, such as about 11 nm. However, any suitable process, any suitable widths, and any suitable lengths may be utilized.

Figure 6C:
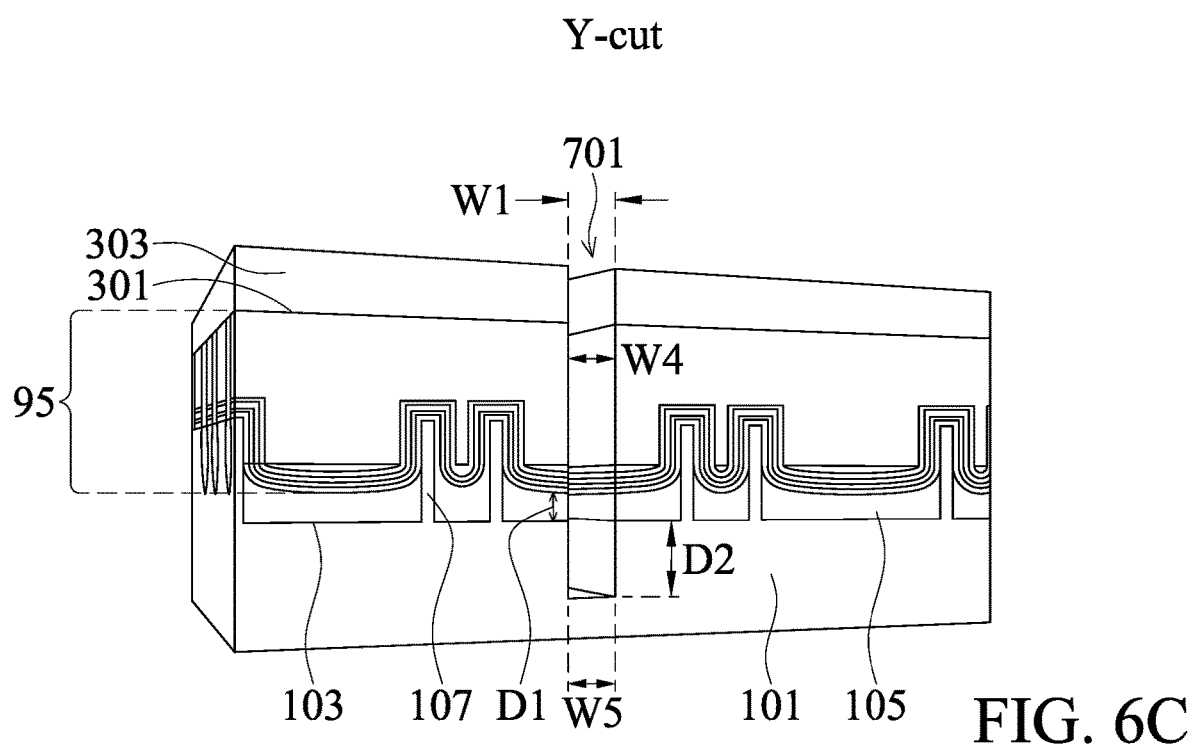

FIGS. 6A-6C illustrate the etching of a trench 701 through the underlying first hard mask 301 and the metal gate stack 95, using, for example, a cycle of repeating deposition and etching processes (with the deposition of the masking layer 601 being the initial deposition step of this cyclical deposition and etching process). In these figures, FIGS. 6A and 6C illustrate the cross-sectional views at the end of the process, while FIG. 6B illustrates an intermediate step during the process prior to removal of a second masking layer 703 (described further below).

As an initial etch, the second pattern 550 (see FIG. 5B) is first extended through the first hard mask 301. In an embodiment the second pattern 550 is extended through the first hard mask 301 to expose the metal gate stack 95 using one or more directional etching processes, such as a reactive ion etching process. However, any suitable method, such as a wet etch breakthrough, may be used to pattern the first hard mask 301.

Once the first hard mask 301 has been patterned, the multi-step etching and deposition process is then utilized to etch through the metal gate stack 95 and extend the second pattern 550 into the substrate 101. For example, the multi-step etching and deposition process may continue, after deposition of the masking layer 601, with a dielectric break through process to expose the underlying material of the metal gate stack 95. In accordance with some embodiments of the present disclosure, the multi-step etching and deposition process (after the initial deposition of the masking layer 601) may continue with an initial etching using process gases selected from, and not limited to, $Cl_2$, $BCl_3$, Ar, $CH_4$, $CF_4$, and combinations thereof. The initial etching of the metal gate stack 95 may be performed with a pressure in the range between about 2.5 mTorr and about 25 mTorr. An RF power is applied in the initial etching, and the RF power may be in the range between about 250 Watts and about 2,500 Watts. A bias voltage in the range between about 25 volts and about 750 volts may also be applied. The initial etching process may be stopped when the initial etching process has extended the second pattern 550 partially, but not all of the way through the metal gate stack 95.

Subsequently, because the initial etching process also works to remove the masking layer 601 (but at a lower rate of removal), a second deposition process is utilized to reform the mask by forming a second masking layer 703 before further etching (described further below) widens the second pattern 550. In an embodiment the second deposition process to form the second masking layer 703 includes sidewall portions on the sidewalls of the trench 701 to protect the sidewalls, so that the upper portions of the trench 701 are not laterally expanded when the trench 701 is extended downwardly. In accordance with some embodiments of the present disclosure, the second deposition process to form the second masking layer 703 is performed using process gases including $SiCl_4$, $O_2$, Ar, and the like. As such, the resulting second masking layer 703 includes $SiO_2$ therein instead of, e.g., silicon nitride, which may or may not be compounded with additional elements such as carbon. However, in other embodiments the second masking layer 703 may also be similar to the material of the masking layer 601, such as by being silicon nitride. The resulting second masking layer 703 may be formed to have a thickness of between about 2 nm and about 4 nm, such as about 3 nm.

Next, another dielectric breakthrough process is performed, so that the bottom portion of the formed second masking layer 703 at the bottom of the trench 701 is removed in an anisotropic etching/bombardment process which also removes the second masking layer 703 from other horizontal surfaces. In accordance with some embodiments, a carbon-and-fluorine gas (such as $C_4F_6$) is used to etch the bottom portion of the second masking layer. According to some embodiments, the thickness of the portion of second masking layer 703 on the top surface of the second masking layer 703 and/or the thickness of the portions of the second masking layer 703 on the sidewalls of the trench 701 may also be reduced during the etching process.

Once the second masking layer 703 has been formed, another etching process is performed to extend the trench 701 deeper into the metal gate stack 95. In an embodiment the next etching process may be performed as described above with respect to the initial etching process. However, any suitable etching process may be utilized.

In accordance with some embodiments, the etching of the metal gate stack 95 utilizes the plurality of deposition-etching cycles, with each cycle including a dielectric-deposition process, a dielectric breakthrough process, and an etching process to extend the trench 701 down. Each of the deposition-etching cycles results in the trench 701 extending further down, until metal gate stack 95 is etched through. In some embodiments, the process may be repeated, for example, two to twenty times, such as 10 times, although any suitable number of repetitions may be utilized.

Additionally, once the metal gate stack 95 has been etched through, the second pattern 550 is further extended into and through the first isolation region 105. In an embodiment the second pattern 550 is extended using the deposition-etching cycles as described above. However, the etching chemistry may be modified as needed based upon the material of the first isolation region 105. However, any other suitable method of extending the second pattern 550 through the first isolation region 105, such as a direct etch without forming the second masking layer 703, may be utilized to expose the underlying substrate 101.

Finally, once the isolation region 103 has been etched through and the semiconductor substrate 101 has been exposed, FIG. 6B illustrates that the second pattern 550 is further extended into the semiconductor substrate to form trench 701. As can be seen, FIG. 6B illustrates an intermediate step within the process after a reforming of the second masking layer 703 but prior to an etching of the substrate 101). In an embodiment the second pattern 550 is extended using the deposition-etching cycles as described above. However, the etching chemistry may be modified if needed based upon the material of the substrate 101.

In accordance with some embodiments of the present disclosure, the etching process of the substrate 101 may be performed using process gases selected from, and not limited to, $Cl_2$, $C_4F_6$, $BCl_3$, $N_2$, $O_2$, HBr, and combinations thereof. The etching may be performed with a pressure in the range between about 5 mTorr and about 50 mTorr. An RF power is applied in the initial etching, and the RF power may be in the range between about 100 Watts and about 2400 Watts. A bias voltage in the range between about 20 volts and about 1000 volts may also be applied.

The repeating cycles of deposition and etching can be repeated as desired in order to extend the second pattern 550 through the substrate 101. In some embodiments the process may be repeated two to ten times, although any suitable number of repetitions may be utilized. Additionally, any other suitable method of extending the second pattern 550 through the substrate 101, such as a direct etch without forming the second masking layer 703, may be utilized to form the bottom portion of the trench 701.

FIG. 6C illustrates that, once the trench 701 has been formed using the second masking layer 703, any remnants of the second masking layer 703 may be removed using multiple cycles of an exposure followed by an anneal process. In one embodiment in which the second masking layer 703 is silicon oxide, the second masking layer 703 may be removed by introducing hydrogen fluoride (HF) and ammonia ($NH_3$) as etchants to the second masking layer 703. The HF and $NH_3$ may react with each other and with the oxide present in the second masking layer 703 to produce $(NH_4)_2SiF_6$ on a surface of the second masking layer 703, which may then be heated using an annealing process to decompose the $(NH_4)_2SiF_6$ into $N_2$, $H_2O$, $SiF_4$, and $NH_3$, all of which may be vapor and may be removed. In an embodiment of the annealing process the second masking layer 703 may be heated to a temperature of between about 80° C. to about 200° C., such as about 100° C. for between about 60 seconds to about 180 seconds. However, any suitable method of removing the second masking layer 703, such as a wet etching process, may also be utilized.

After the removal of the second masking layer 703, an optional second wet clean may be performed to prepare the structure for subsequent processing. In an embodiment a solution such as an SC-1 or SC-2 cleaning solution may be utilized, although other solutions, such as a mixture of $H_2SO_4$ and $H_2O_2$ (known as SPM), or a solution of hydrogen fluoride (HF), may also be utilized. However, any suitable solutions or any suitable processes may be used and are fully intended to be included within the scope of the embodiments.

Once the second masking layer 703 has been fully removed and cleaned, the trench 701 extends through the metal gate stack 95, the first isolation region 105, and into the substrate 101. According to some embodiments, the trench 701 is formed to a fourth width W4 at a level of the tops of the fins, a fifth width W5 at a bottom of the trench 701 less than the fourth width W4, through a first depth D1 of the first isolation region 105, and through a second depth D2 into the substrate 101. According to some embodiments, the trench 701 is formed to the fourth width W4 of between about 14 nm and about 24 nm, the fifth width W5 of between about 1 nm and about 30 nm, such as about 15 nm, the first depth D1 of between about 30 nm and about 90 nm, such as about 40 nm, or such as about 80 nm, and the second depth D2 of between about 0 nm and about 40 nm, such as about 30 nm. However, any suitable widths and any suitable depths may be used for the fourth width W4, the first depth D1 and the second depth D2 of the trench 701.

Figure 7A:
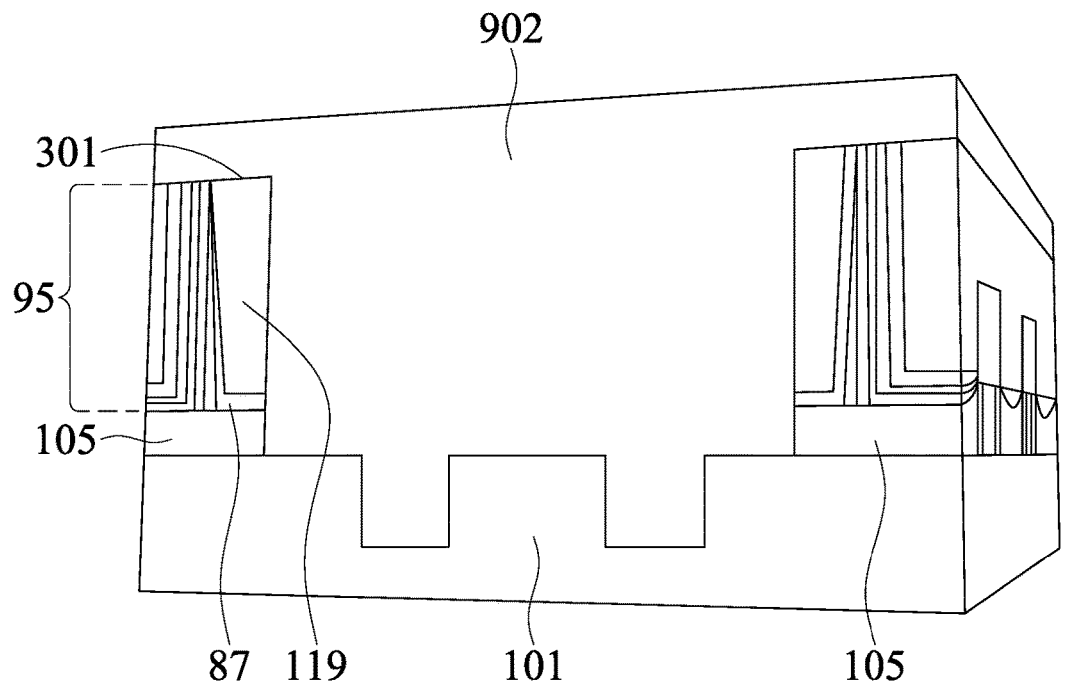
Figure 7B:
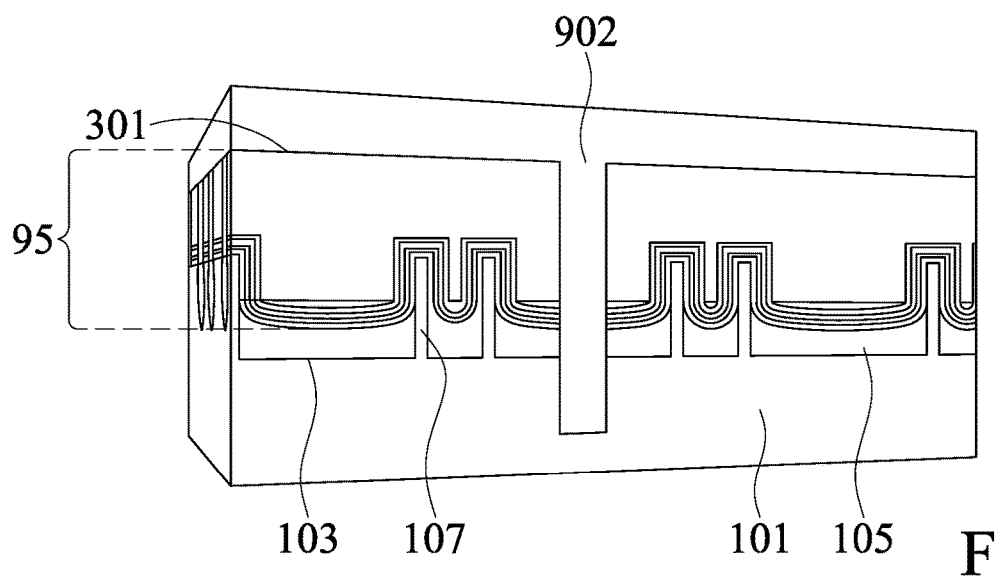

FIGS. 7A-7B illustrate a filling of the trench 701 with a fill material 902 to finish the separation of the metal gate stack 95. In an embodiment the fill material 902 may be a single layer of material or else may be one or more layers of material, such as a dual layer of materials. In an embodiment one layer or each layer of materials may comprise a material such as silicon nitride (SiN) or silicon carbon nitride (SiCN). However, any suitable material or combination of materials may be utilized. In some embodiments, the fill material 902 may be deposited using a deposition process such as ALD, CVD, or PVD to a thickness of between about 20 nm and about 50 nm, such as about 30 nm. However, any suitable deposition process and any suitable thicknesses may be utilized for the fill material 902.

Figure 8A:
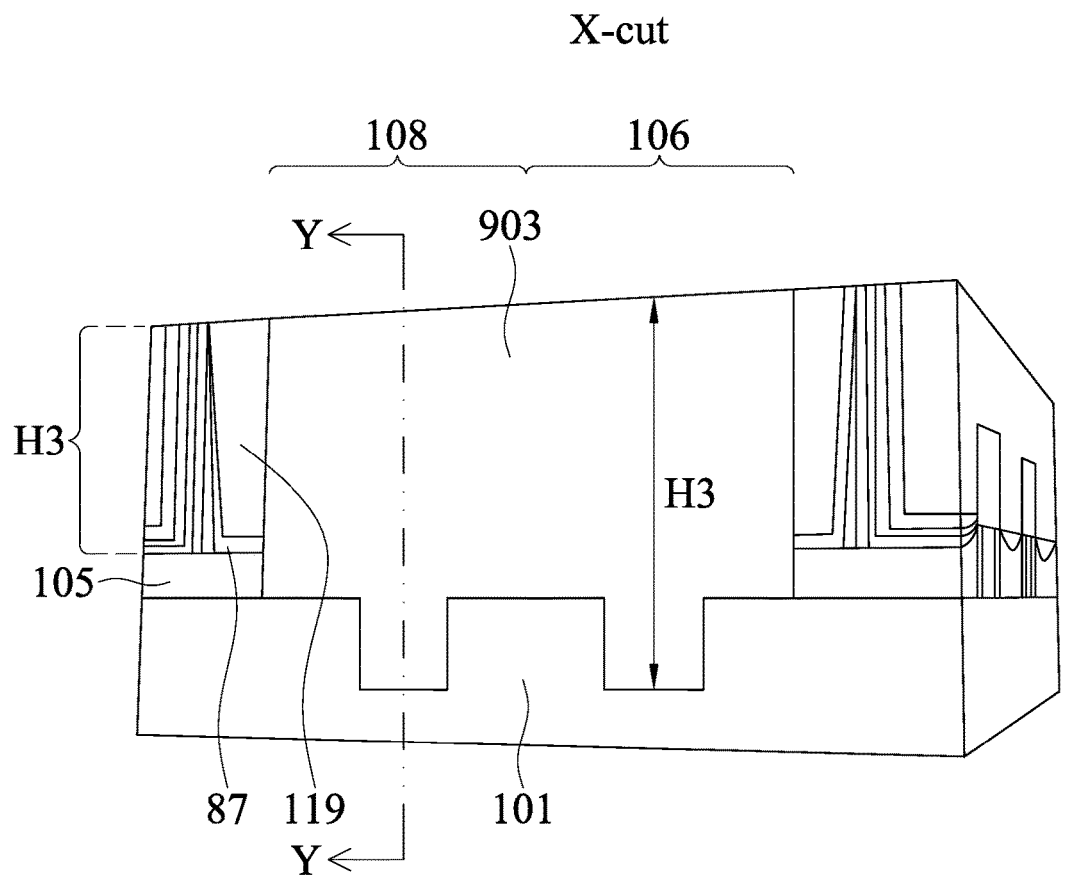
Figure 8B:
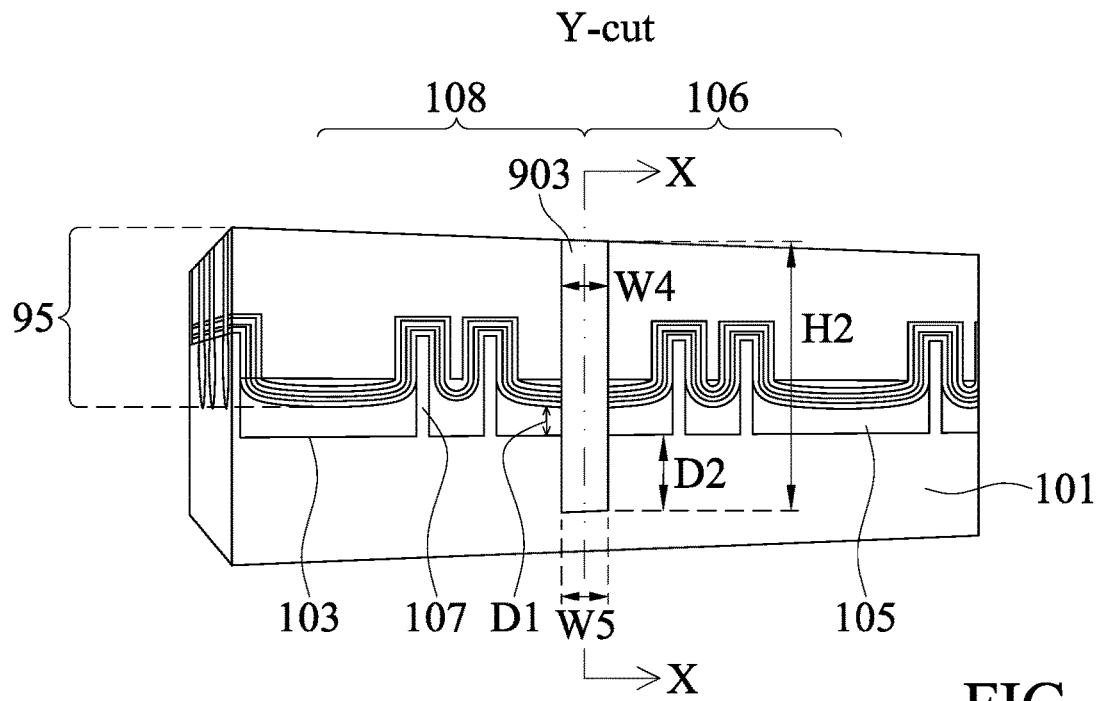

FIGS. 8A-8B illustrate a planarization of the fill material 902 and a removal of the first hard mask 301. In an embodiment the planarization may be a process such as a chemical mechanical polishing process which is utilized to planarize the fill material 902 with the metal gate stack 95 and the first spacers 113. During the process the first hard mask 301 is also removed. As such, an anchored cut metal gate plug 903 is formed through the metal gate stack 95, effectively "cutting" the metal gate stacks from each other, through the first isolation regions 105, and into the substrate 101 of the semiconductor device 100. According to some embodiments, the anchored CMG plug 903 is formed to a second height H2 of between about 60 nm and about 90 nm, such as about 75 nm. However, any suitable heights may be used.

Furthermore, the chemical mechanical polishing process that is used to remove excess fill material 902 may be also be utilized to reduce the height of the metal gate stack 95 at this time. In an embodiment the height of the metal gate stack 95 over the fins 107 may be reduced to a third height H3 of between about 200 Å and about 400 Å. However, any suitable reduction of height may be utilized.

Additionally, as can be seen in FIG. 8A, by forming the anchored CMG plug 903 as described, the anchored CMG plug 903 can extend into multiple trenches that are formed within the substrate 101. These trenches are formed separate from each other as the etching process (described above with respect to FIGS. 6A-6C) etches the materials over the trenches (e.g., the metal gate stacks 95) faster than the material between the trenches (e.g., the ILD layer 119). As such, the anchored CMG plug 903 can continuously extend from being within one trench within the substrate 101 to within a second trench within the substrate 101.

Figure 9:
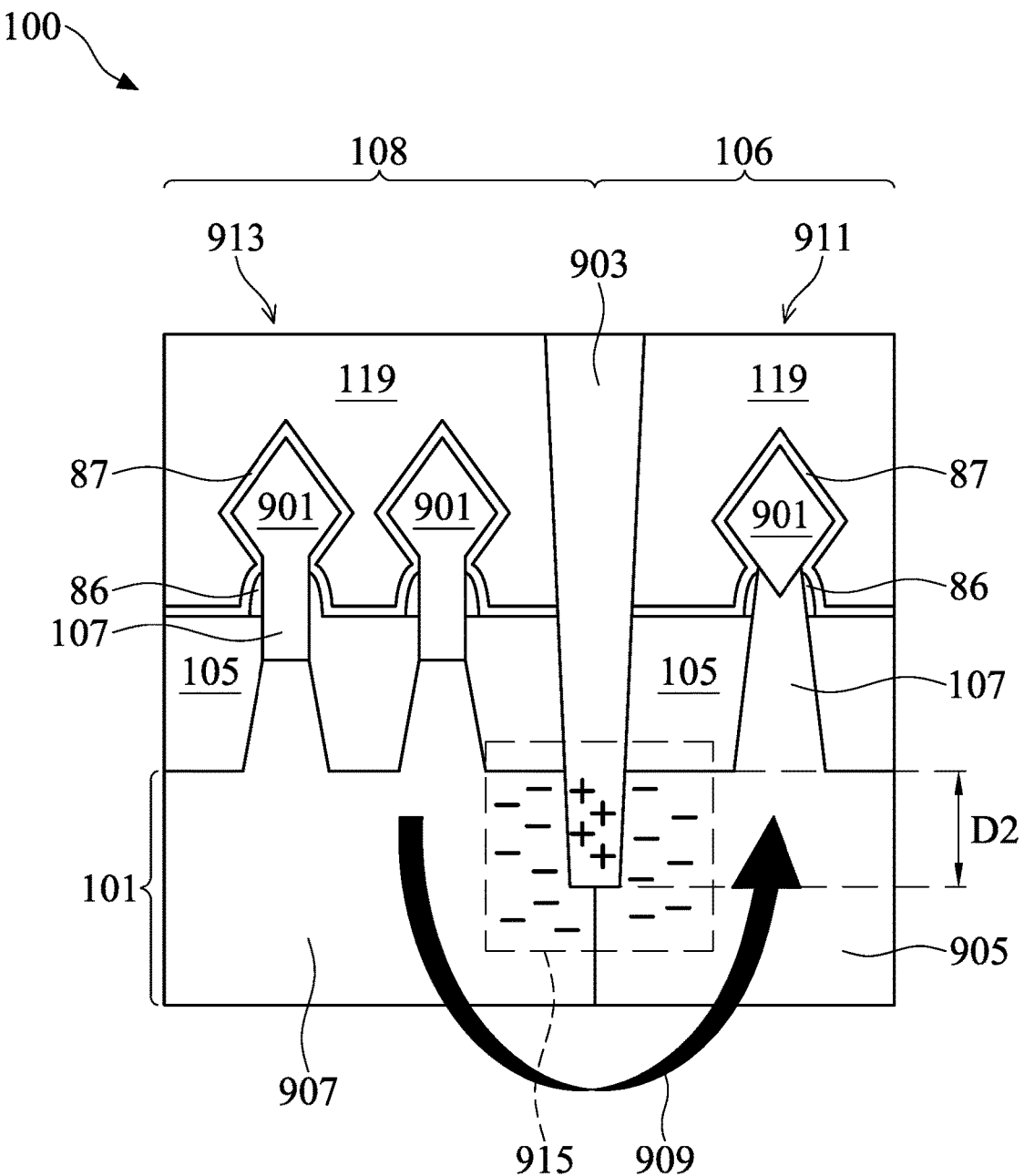
FIG. 9 illustrates a cross-sectional view of an anchored cut metal plug adjacent to source/drain regions, in accordance with some embodiments.

FIG. 9 illustrates a cross-sectional view taken through the source/drain regions 901 of two adjacent devices of the first device region 106 and the second device region 108 during operation, according to some embodiments. In a particular embodiment, an n-type device 911 (e.g., an NMOS device) may be formed in the first device region 106 and a p-type device 913 (e.g., a PMOS device) may be formed in the second device region 108 adjacent the n-type device 911 and are separated by the anchored CMG plug 903 of the semiconductor device 100. The source/drain regions 901 may be formed using the spacers 86 and coated with the CESL 87 and embedded in the ILD layer 119 using the materials and processes detailed above during the discussion of FIGS. 1A and 1B.

Once the source/drain regions 901 and the metal gate stacks 95 have been formed in the first device regions 106 and in the second device regions 108, the anchored CMG plug 903 may be formed, as described above. During formation of the opening 701 through the metal gate stacks 95 as described above, the opening 701, according to some embodiments, may also be formed through the ILD layer 119, the CESL 87, and the first isolation regions 105 and into the substrate 101 between the source/drain regions 901 of adjacent devices in one or more of the first device regions 106 and the second device regions 108. According to some embodiments, the opening 701 may be cut into the substrate 101 at an interface between a first doped region 905 (e.g., p-well) of the n-type device 911 and a second doped region 907 (e.g., n-well) of the p-type device 913 and the anchored CMG plug 903 is formed within the opening 701 as described above and as illustrated in FIG. 9.

According to embodiments disclosed herein, the anchored CMG plug 903 provides high levels of resistance to reduce leakage current (e.g., break down e-current), illustrated by the directional arrow 909, at an interface between doped regions within the semiconductor device 100 during operation. For example, the anchored CMG plug 903 can trap negative electrons in an anchored region 915 at the interface between a first doped region 905 (e.g., p-well) of the n-type device 911 and a second doped region 907 (e.g., n-well) of the p-type device 913. As the depth of the anchored CMG plug 903 increases into the substrate 101 (e.g., the second depth D2), greater levels of resistance are provided by the CMG plug 903 at these interfaces. As such, the anchored CMG plug 903 provides for further reduction of leakage current allowing for improved V-trigger performance of the semiconductor device 100.

Such improved V-trigger performance can be seen in the V-trigger test results. For example, in some embodiments which utilize the above described process, the V-trigger may be increased to be between about 1740 mV and about 1970 mV. This is much higher than baseline measurements which do not utilize the embodiments of between about 1620 mV and 1850 mV. As such, an increase of about 120 mV can be achieved.

Figure 10A:
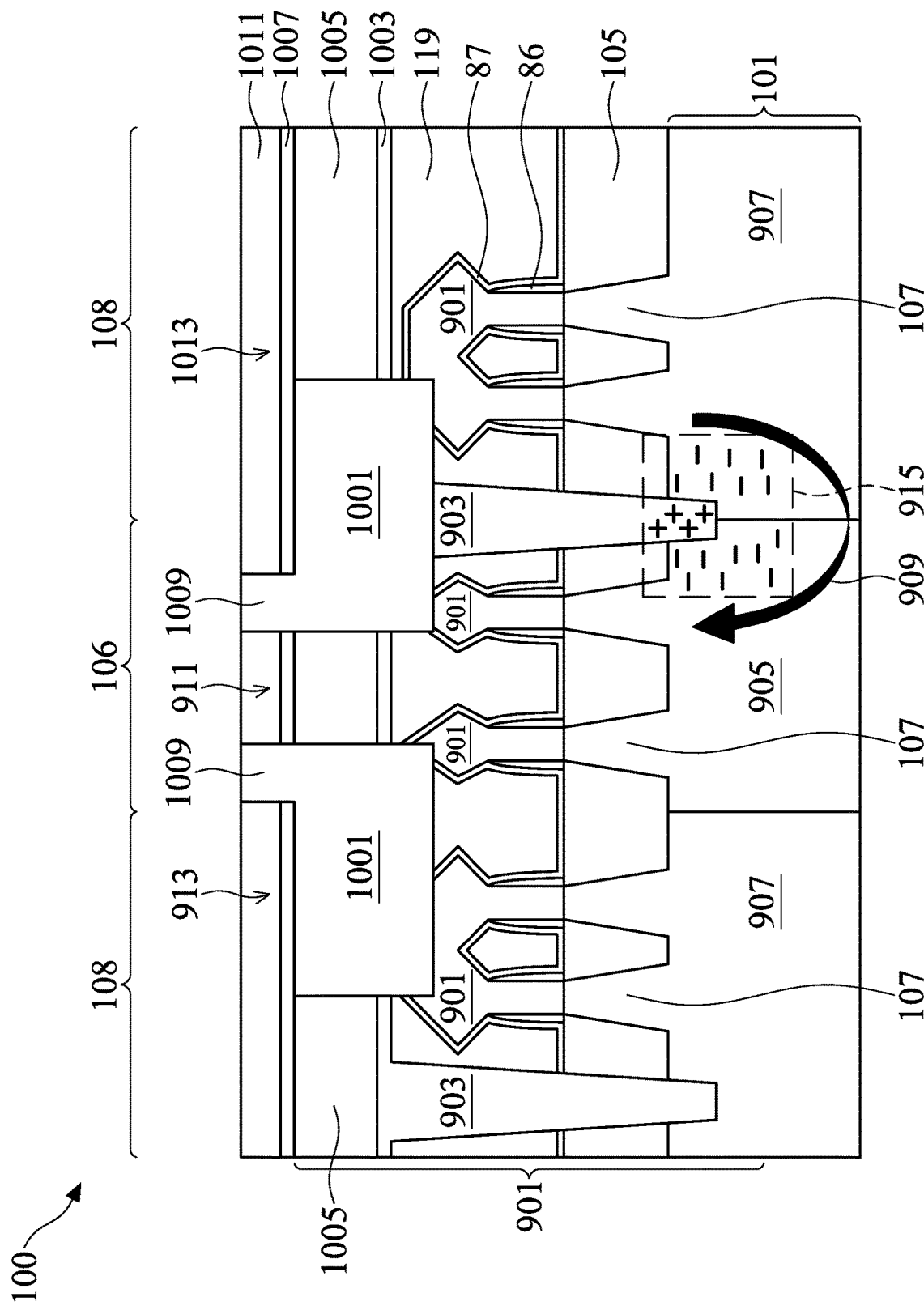
FIGS. 10A-10B illustrate cross-sectional views of anchored cut metal plugs between devices, in accordance with some embodiments.
Figure 10B:
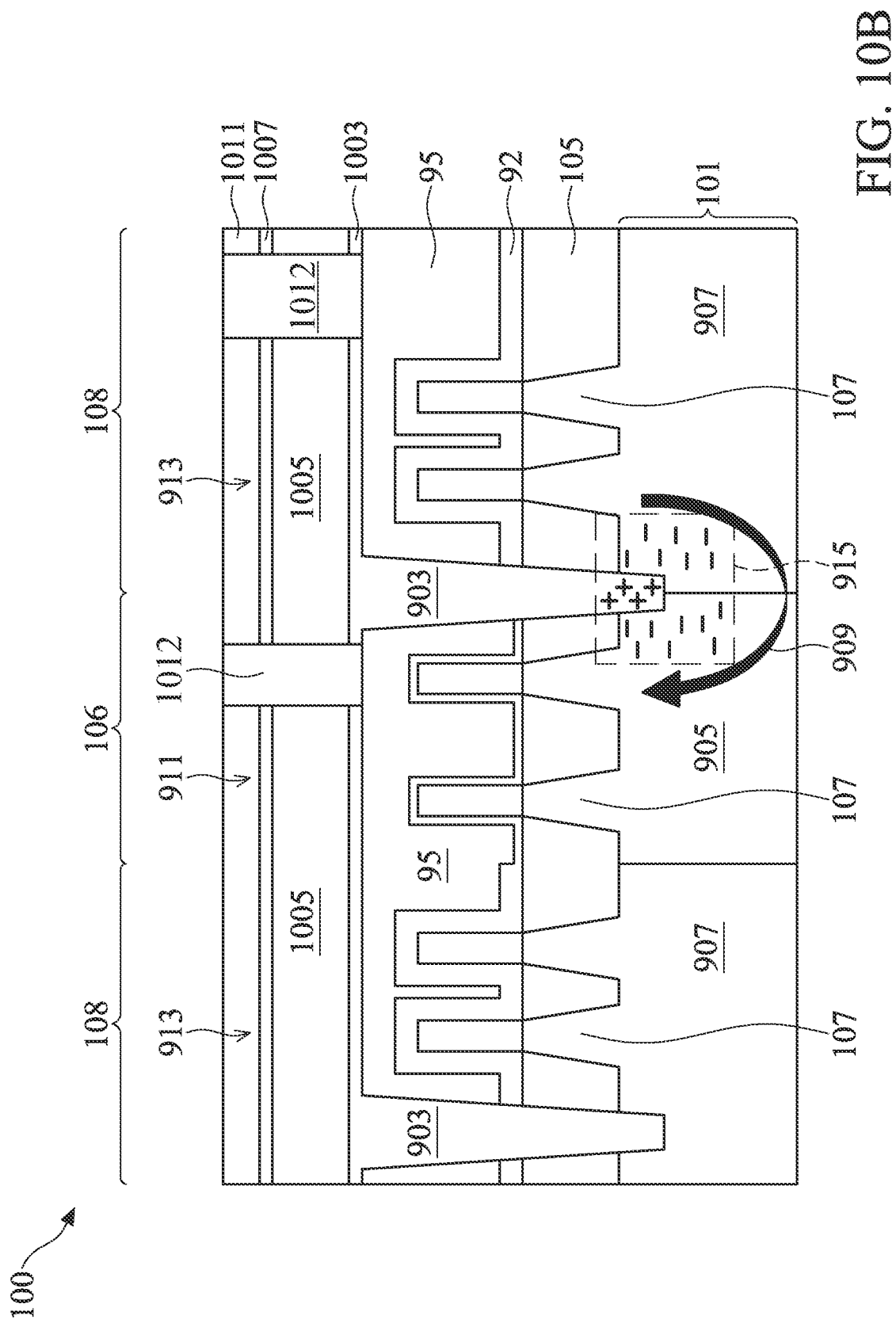

FIGS. 10A and 10B illustrate cross-sectional views taken through the source/drain regions 901 and the metal gate stacks 95, respectively, of three adjacent devices according to some other embodiments during operation of the semiconductor device 100. The three adjacent devices (going from left to right) include the first p-type device 913 (e.g., PMOS) formed in the second device region 108, the n-type device 911 (e.g., NMOS) formed in the first device region 106 and a second p-type device 1013 (e.g., PMOS) formed in another one of the second device regions 108. FIGS. 10A and 10B further illustrate the formation of source/drain contact structures 1001, source/drain conductive plugs 1009, and gate contact structures 1012, according to some embodiments. The source/drain conductive plugs 1009 and gate contact structures 1012 provide external connection to the source/drain regions 901 and the metal gate stacks 95 of the three adjacent devices.

FIG. 10A further illustrates the source/drain regions 901 in the first p-type device 913 are formed over the fins 107 as a merged epitaxial growth structure, the epitaxial growth material of the source/drain regions 901 in the second p-type device 1013 are formed over the fins 107 as a merged epitaxial growth structure, and the epitaxial growth regions of the source/drain regions 901 in the n-type device 911 are formed as individual epitaxial growth regions that remain separated from one another, according to a particular embodiment.

FIG. 10A further illustrates two of the anchored CMG plugs 903 formed adjacent the source/drain regions 901 of the three adjacent devices, according to some embodiments. A first plug of the anchored CMG plugs 903 is formed adjacent the first p-type device 913 and is embedded within the substrate 101 of the first p-type device 913. A second plug of the anchored CMG plugs 903 is embedded within the substrate 101 at an interface between the n-type device 911 and the second p-type device 1013, according to some embodiments. As such, during operation of the semiconductor device 100, the second plug of the anchored CMG plugs 903 provides high levels of resistance to reduce leakage current (e.g., break down e-current) between the n-type device 911 and the second p-type device 1013, as is illustrated by the directional arrow 909. As such, during operation of the semiconductor device 100, electrons are trapped in the anchored region 915 at the interface between the first doped region 905 (e.g., p-well) of the n-type device 911 and a second doped region 907 (e.g., n-well) of the second p-type device 1013.

The source/drain contact structures 1001 may be formed by initially forming a first isolation layer 1003 (e.g., an etch stop layer) over the planar surfaces of the ILD layer 119, the anchored CMG plugs 903. In some embodiments, the first isolation layer 1003 may be formed by overfilling the openings 701 with the material of the anchored CMG plugs 903 and reducing the height of the overfill material to a desired height of the first isolation layer 1003. In other embodiments, another dielectric layer is deposited over the planarized surfaces of the ILD layer 119 and the anchored CMG plugs 903 using any of the materials (e.g., SiN) and processes (e.g., plasma enhanced chemical vapor deposition (PECVD) and/or chemical mechanical planarization (CMP)) that are suitable for depositing and planarizing the anchored CMG plugs 903, as described above. According to some embodiments, the first isolation layer 1003 may be formed to a thickness of between about 10 Å and about 200 Å, such as about 50 Å. However, any other suitable materials, processes, and thicknesses may be used.

Once the first isolation layer 1003 has been formed, a second ILD layer 1005 is deposited over the first isolation layer 1003 using any of the materials and any of the methods used to form the first ILD layer 119. In some embodiments, the second ILD layer 1005 may be formed to a thickness of between about 10 Å and about 500 Å, such as about 100 Å. However, any suitable materials, any suitable deposition methods, and any suitable thicknesses may be used to form the second ILD layer 1005.

Once the second ILD layer 1005 has been formed, a masking layer (not separately illustrated in FIGS. 10A-10B) may be deposited and patterned using photolithography method to form openings through the masking layer and to expose surfaces of the second ILD layer 1005 in areas overlying the source/drain regions 901. Openings are formed into these areas using the mask and one or more suitable etching processes (e.g., an anisotropic reactive ion etching (RIE)) and one or more process gases (e.g., carbon- and-fluorine-containing gases such as $CF_4$, $CH_2F_2$, $CHF_3$, or the like) to remove the materials overlying the source/drain regions 901. In some embodiments during removal of the first ILD layer 119, the material of the anchored CMG plug 903 adjacent one or more of the source/drain regions 901 may also be etched resulting in a pullback of the anchored CMG plug 903. Once the openings have been formed and the source/drain regions 901 have been exposed, the masking layer is removed, for example, via an ashing process and an optional cleaning processes may be performed in the openings prior to forming the source/drain contact structures 1001.

According to some embodiments, the source/drain contact structures 1001 are formed in the openings by depositing one or more conductive materials such as a liner (e.g., a diffusion barrier layer, an adhesion layer, or the like) and a conductive material. Examples of materials that may be used for the liner include titanium, titanium nitride, tantalum, tantalum nitride, or the like and examples of materials that may be used for the conductive material include tungsten, copper, a copper alloy, silver, gold, cobalt, aluminum, nickel, or the like and these materials may be deposited using electroplating, electroless plating, printing, chemical vapor deposition (CVD) process or physical vapor deposition (PVD) process. Once the conductive material has been deposited, a planarization process, such as a CMP, may be performed to remove excess material from a surface of the second ILD layer 1005 and planarizing the source/drain contact structures 1001 with the second ILD layer 1005. If desired, an optional silicide may be formed along surfaces of the source/drain regions 901 prior to formation of the source/drain contact structures 1001. As such, the source/drain contact structures 1001 over the source/drain regions 901 are physically and electrically coupled to the exposed portions of the epitaxial growth material of the source/drain regions 901. In some embodiments, the source/drain contact structures 1001 may be formed over and interfacing the anchored cut metal gate plug 903. The source/drain contact structures 1001 over the source/drain regions 901 in different device regions may be formed using different materials and different processes, or may be formed using the same materials and using the same processes.

FIG. 10A illustrates that one of the source/drain contact structures 1001 is formed over and physically connected to both the merged epitaxial growth structures 901 of the first p-type device 913 and one of the individual epitaxial growth structures 901 of the n-type device 911, according to some embodiments. Another one of the source/drain contact structures 1001, according to some embodiments, is formed over and physically connected to the anchored cut metal gate plug 903 and is formed over and physically connected to both the merged epitaxial growth structures 901 of the second p-type device 1013 and one of the individual epitaxial growth structures 901 of the n-type device 911.

Once the source/drain contact structures 1001 are planarized with the second ILD layer 1005, the source/drain conductive plugs 1009 are formed over the source/drain contact structures 1001. The source/drain conductive plugs 1009 may be formed by initially forming a second isolation layer 1007 (e.g., a second etch stop layer) and a third ILD layer 1011 over the planar surfaces of the source/drain contact structures 1001 and the second ILD layer 1005. The second isolation layer 1007 and the third ILD layer 1011 may be formed similar to the first isolation layer 1003 and the second ILD layer 1005, although any suitable materials and methods may be utilized.

Once the second isolation layer 1007 and the third ILD layer 1011 have been deposited, the second isolation layer 1007 and the third ILD layer 1011 may be patterned to expose portions of the source/drain contact structures 1001. The openings may be formed through the third ILD layer 1011 and the second isolation layer 1007 by using any of the etching processes and process gases suitable for forming the openings for the source/drain contact structures 1001, as set forth above. In some embodiments, the patterning process to expose the source/drain contact structures 1001 may also be used to expose areas of the source/drain contact structures 1001 in preparation for formation of gate contact structures 1012 (as can be seen in FIG. 10B). The source/drain conductive plugs 1009 may be formed over the exposed areas of the source/drain contact structures 1001. The source/drain conductive plugs 1009 may be formed using any of the materials and processes suitable for forming the source/drain contact structures 1001, set forth above. According to some embodiments, the gate contact structures 1012 and the source/drain contact plugs 1009 comprise a barrier layer and a conductive material.

FIG. 10B further illustrates the formation of the gate contact structures 1012 over the metal gate stacks 95, according to some embodiments. In an embodiment the gate contact structures 1012 may be formed either with the source/drain contact plugs 1009 or else using processes and materials similar to the source/drain contact plugs 1009 (e.g., a photolithographic masking and etching process followed by a conductive fill process). According to some embodiments, the first p-type device 913 and the n-type device 911 may share a common gate stack formed over the fins 107 of both devices, as illustrated in FIG. 10B. As such, a single gate contact structures 1012 may be used as an external connection to the gate electrodes of both of the first p-type device 913 and the n-type device 911. FIG. 10B further illustrates that the 903 may be used to separate the metal gate stacks 95 of the n-type device 911 from the metal gate stacks 95 of the second p-type device 913, according to some embodiments.

According to an embodiment, a method includes forming a fin over a semiconductor substrate; forming a metal gate over the fin; etching the metal gate to form a trench through the metal gate and into the semiconductor substrate; and depositing a dielectric material in the trench, wherein the dielectric material extends into the semiconductor substrate at an interface between an n-type device and a p-type device. In an embodiment, after the etching the metal gate, the trench extends into the semiconductor substrate no more than 40 nm. In an embodiment, the etching the metal gate into the semiconductor substrate forms multiple recesses within the semiconductor substrate. In an embodiment, the etching the metal gate further comprises performing a series of deposition-etching processes. In an embodiment, the performing the series of deposition-etching processes comprises depositing a dielectric sidewall liner prior to performing an etch process. In an embodiment, the method further includes planarizing the dielectric material. In an embodiment, the depositing the dielectric material deposits silicon nitride.

According to an embodiment, the method includes patterning a semiconductor substrate to form an isolation region and a fin in the semiconductor substrate; forming a metal gate stack over the fin and over the isolation region; performing a plurality of etching cycles to remove portions of the metal gate stack, the isolation region and the semiconductor substrate to form an opening through the metal gate stack, through the isolation region, and into the semiconductor substrate, the performing the plurality of etching cycles separating a first portion of the metal gate stack and a second portion of the metal gate stack; and depositing a dielectric material to fill the opening. In an embodiment, the performing the plurality of etching cycles further includes depositing a liner; and etching through a portion of the liner. In an embodiment, the performing the plurality of etching cycles further includes extending the opening after the etching through the portion of the liner. In an embodiment, the opening includes a first recess within the semiconductor substrate; and a second recess within the semiconductor substrate, the second recess being separate from the first recess. In an embodiment, the method further includes planarizing the dielectric material with a top surface of the metal gate stack. In an embodiment, after the planarizing the dielectric material, the dielectric material is continuous from a point within the first recess to a point within the second recess. In an embodiment, a width of the opening at a level of an upper surface of the fin is formed to a first width and a width at a level of the semiconductor substrate is formed to a second width less than the first width.

According to an embodiment, a semiconductor device includes: a first gate electrode of an n-type device over a first fin over a semiconductor substrate; a second gate electrode of a p-type device over a second fin over the semiconductor substrate; and a cut-metal gate plug separating the first gate electrode from the second gate electrode, wherein the cut-metal gate plug extends into the semiconductor substrate at an interface between the n-type device and the p-type device. In an embodiment, the cut-metal gate plug extends into the semiconductor substrate less than about 40 nm. In an embodiment, the device further includes an isolation region between the first fin and the second fin, the cut-metal gate plug extending through the isolation region. In an embodiment, a source/drain contact structure of the n-type device is formed over the cut metal gate plug. In an embodiment, the cut-metal gate plug includes silicon nitride. In an embodiment, the device includes a finFET transistor formed with the first gate electrode has a V-trigger of between about 1850 mV and 1970 mV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
 forming a fin over a semiconductor substrate;
 forming a metal gate over the fin;
 etching the metal gate to form a trench through the metal gate and into the semiconductor substrate, wherein the trench comprises a first recess within the semiconductor substrate and a second recess within the semiconductor substrate, the second recess being separate from the first recess; and
 depositing a dielectric material in the trench, wherein the dielectric material extends into the semiconductor substrate at an interface between an n-type device and a p-type device.

2. The method of claim 1, wherein after the etching the metal gate the trench extends into the semiconductor substrate no more than 40 nm.

3. The method of claim 1, wherein the etching the metal gate further comprises performing a series of deposition-etching processes.

4. The method of claim 3, wherein the performing the series of deposition-etching processes comprises depositing a dielectric sidewall liner prior to performing an etch process.

5. The method of claim 1, further comprising planarizing the dielectric material.

6. The method of claim 1, wherein the depositing the dielectric material deposits silicon nitride.

7. The method of claim 1, wherein the depositing the dielectric material forms a first portion in the first recess and a second portion in the second recess.

8. A method comprising:
   patterning a semiconductor substrate to form an isolation region and a fin in the semiconductor substrate;
   forming a metal gate stack over the fin and over the isolation region;
   performing a plurality of etching cycles to remove portions of the metal gate stack, the isolation region and the semiconductor substrate to form an opening through the metal gate stack, through the isolation region, and into the semiconductor substrate, the performing the plurality of etching cycles separating a first portion of the metal gate stack and a second portion of the metal gate stack, wherein the performing the plurality of etching cycles comprises depositing a liner and etching through a portion of the liner; and
   depositing a dielectric material to fill the opening.

9. The method of claim 8, wherein the performing the plurality of etching cycles further comprises extending the opening after the etching through the portion of the liner.

10. The method of claim 8, wherein the opening comprises:
    a first recess within the semiconductor substrate; and
    a second recess within the semiconductor substrate, the second recess being separate from the first recess.

11. The method of claim 10, further comprising planarizing the dielectric material with a top surface of the metal gate stack.

12. The method of claim 11, wherein after the planarizing the dielectric material the dielectric material is continuous from a point within the first recess to a point within the second recess.

13. The method of claim 8, wherein a width of the opening at a level of an upper surface of the fin is formed to a first width and a width at a level of the semiconductor substrate is formed to a second width less than the first width.

14. The method of claim 8, wherein the depositing the dielectric material deposits silicon carbon nitride.

15. A semiconductor device comprising:
    a first gate electrode of an n-type device over a first fin over a semiconductor substrate;
    a second gate electrode of a p-type device over a second fin over the semiconductor substrate; and
    a cut-metal gate plug separating the first gate electrode from the second gate electrode, wherein the cut-metal gate plug extends into the semiconductor substrate at an interface between the n-type device and the p-type device, and wherein a width of the cut-metal gate plug at a level of an upper surface of the first fin is formed to a first width and a width at a level of the semiconductor substrate is formed to a second width less than the first width.

16. The semiconductor device of claim 15, wherein the cut-metal gate plug extends into the semiconductor substrate less than about 40 nm.

17. The semiconductor device of claim 15, further comprising an isolation region between the first fin and the second fin, the cut-metal gate plug extending through the isolation region.

18. The semiconductor device of claim 15, wherein a source/drain contact structure of the n-type device is formed over the cut metal gate plug.

19. The semiconductor device of claim 15, wherein the cut-metal gate plug comprises silicon nitride.

20. The semiconductor device of claim 15, wherein a finFET transistor formed with the first gate electrode has a V-trigger of between about 1850 mV and 1970 mV.

* * * * *